(12) United States Patent
Kitaoka et al.

(10) Patent No.: US 7,309,534 B2
(45) Date of Patent: Dec. 18, 2007

(54) GROUP III NITRIDE CRYSTALS USABLE AS GROUP III NITRIDE SUBSTRATE, METHOD OF MANUFACTURING THE SAME, AND SEMICONDUCTOR DEVICE INCLUDING THE SAME

(75) Inventors: Yasuo Kitaoka, Ibaraki (JP); Hisashi Minemoto, Hirakata (JP); Isao Kidoguchi, Kawanishi (JP); Takatomo Sasaki, Suita (JP); Yusuke Mori, 8-16-9, Kisaichi, Katano-shi, Osaka (JP) 576-0033; Fumio Kawamura, Minoh (JP); Masanori Morishita, Ibaraki (JP)

(73) Assignees: Matsushita Electric INdustrial Co., Ltd., Osaka (JP); Yusuke Mori, Osaka (JP)

( * ) Notice: Subject to any disclaimer, the term of this patent is extended or adjusted under 35 U.S.C. 154(b) by 276 days.

(21) Appl. No.: 10/856,467

(22) Filed: May 27, 2004

(65) Prior Publication Data

US 2004/0262630 A1    Dec. 30, 2004

(30) Foreign Application Priority Data

May 29, 2003 (JP) ............................. 2003-153237
Aug. 29, 2003 (JP) ............................. 2003-306914
Mar. 24, 2004 (JP) ............................. 2004-087743

(51) Int. Cl.
*B32B 9/00* (2006.01)
*B32B 18/00* (2006.01)
*C30B 9/00* (2006.01)

(52) U.S. Cl. ...................... 428/698; 428/701; 428/702; 428/446; 428/450; 117/73; 117/74; 117/952

(58) Field of Classification Search ...................... None
See application file for complete search history.

(56) References Cited

U.S. PATENT DOCUMENTS 5,868,837 A    2/1999    DiSalvo et al.

(Continued)

FOREIGN PATENT DOCUMENTS

JP    11-145516    5/1999

(Continued)

OTHER PUBLICATIONS

M. Morishita, et al. "The growth mechanism of GaN singles crystals in Na flux system", Journal of the Japanese association for crystal growth, vol. 30, No. 3 (2003), 801aA7.

(Continued)

*Primary Examiner*—Jennifer C. McNeil
*Assistant Examiner*—Timothy M. Speer
(74) *Attorney, Agent, or Firm*—Hamre, Schumann, Mueller & Larson, P.C.

(57) ABSTRACT

The present invention provides a method of manufacturing Group III nitride crystals that are of high quality, are manufactured highly efficiently, and are useful and usable as a substrate that is used in semiconductor manufacturing processes. The method of manufacturing Group III nitride crystals includes: forming a first layer made of a semiconductor that is expressed by a composition formula of $Al_sGa_tIn_{1-s-t}N$ (where $0 \leq s \leq 1$, $0 \leq t \leq 1$, and $s+t \leq 1$); forming a second layer by bringing the surface of the first layer into contact with a melt in an atmosphere including nitrogen, wherein the second layer includes greater defects in a crystal structure, such as a dislocation density for example, than those of the first layer, and the melt includes alkali metal and at least one Group III element selected from the group consisting of gallium, aluminum, and indium; and forming a third layer through crystal growth in the melt in an atmosphere including nitrogen, wherein the third layer is made of a semiconductor that is expressed by a composition formula of $Al_uGa_vIn_{1-u-v}N$ (where $0 \leq u \leq 1$, $0 \leq v \leq 1$, and $u+v \leq 1$), and the third layer has less defects in a crystal structure, such as a dislocation density for example, than those of the second layer.

55 Claims, 18 Drawing Sheets

U.S. PATENT DOCUMENTS

| | | | |
|---|---|---|---|
| 6,121,121 | A | 9/2000 | Koide |
| 6,252,255 | B1 | 6/2001 | Ueta et al. |
| 6,270,569 | B1 | 8/2001 | Shibata et al. |
| 6,447,604 | B1 | 9/2002 | Flynn et al. |
| 6,503,610 | B2 | 1/2003 | Hiramatsu et al. |
| 6,592,663 | B1 | 7/2003 | Sarayama et al. |
| 6,614,059 | B1 * | 9/2003 | Tsujimura et al. .......... 257/101 |
| 6,667,252 | B2 | 12/2003 | Miyajima et al. |
| 2003/0042496 | A1 | 3/2003 | Sasaoka |
| 2004/0124434 | A1 | 7/2004 | D'Evelyn et al. |
| 2004/0144300 | A1 | 7/2004 | Kitaoka et al. |
| 2004/0147096 | A1 | 7/2004 | Kitaoka et al. |
| 2004/0183090 | A1 | 9/2004 | Kitaoka et al. |
| 2005/0011432 | A1 | 1/2005 | Kitaoka et al. |
| 2005/0082564 | A1 | 4/2005 | Kitaoka et al. |
| 2006/0051942 | A1 | 3/2006 | Sasaki et al. |

FOREIGN PATENT DOCUMENTS

| | | |
|---|---|---|
| JP | 2003-357663 | 12/2000 |
| JP | 2002-293696 | 10/2002 |
| JP | 3409576 | 3/2003 |
| WO | 2004/013385 | 2/2004 |

OTHER PUBLICATIONS

M. Morishita, et al., "Growth of transparent GaN single crystals using LPE technique in Na flux system", The Japan Society of Applied Physics and Related Societies, Extended Abstracts (The 51st Spring Meeting, 2004), 29 p-YK-6.

"Generation and propagation of dislocations during crystal growth", H. Klapper, Materials Chemistry and Physics, 66 (2000) 101-109.

"Se and Zn vapor pressure control in ZnSe single crystal growth by the sublimation method", Tamura et al., Journal of Crystal Growth, 209 (2000) 675-682.

"Non-radiative Nature of Threading Dislocations in GaN Grown by Metal-organic Chemical Vapor Deposition", Miyajima et al., Proc. Int. Workshop on Nitride Semiconductors, IPAP Conf. Series 1 pp. 536-539.

"Drastic reduction of threading dislocation in GaN regrown on grooved stripe structure", Ishida et al., Journal of Crystal Growth 221 (2000) 345-349.

Kozawa, et al., "Raman scattering from LO phonon-plasmon coupled modes in gallium nitride", Journal of Applied Physics, Jan. 15, 1994, 74(2), 1098-1101—Abstract Only.

* cited by examiner

GROUP III NITRIDE CRYSTALS USABLE AS GROUP III NITRIDE SUBSTRATE, METHOD OF MANUFACTURING THE SAME, AND SEMICONDUCTOR DEVICE INCLUDING THE SAME

BACKGROUND OF THE INVENTION

1. Field of the Invention

The present invention relates generally to Group III nitride crystals that can be used as a Group III nitride substrate, a method of manufacturing the same, and a semiconductor device with the same.

2. Related Background Art

A Group III nitride compound semiconductor such as, for instance, gallium nitride (GaN) (hereinafter also referred to as a "Group III nitride semiconductor" or a "GaN-based semiconductor") has been gaining attention as a material for semiconductor devices that emit blue or ultraviolet light. A laser diode (LD) that emits blue light is used for high-density optical disk devices or displays while a light emitting diode (LED) that emits blue light is used for displays, lighting, etc. It is expected to use an ultraviolet LD in the field of high technology such as, for example, biotechnology and an ultraviolet LED as, for example, an ultraviolet source for a fluorescent lamp.

Substrates of a Group III nitride semiconductor (for example, GaN) that are used for LDs or LEDs are formed, for instance, through vapor phase epitaxy. In this method, a sapphire substrate is used as the substrate and Group III nitride crystals are grown heteroepitaxially on the substrate. Generally, crystals obtained by this method have a dislocation density of about $10^8$ cm$^{-2}$ to $10^9$ cm$^{-2}$ and thus the reduction in dislocation density has been an important issue for this method. In order to resolve this issue, for example, an epitaxial lateral overgrowth (ELOG) method has been developed (see, for instance, JP11(1999)-145516A). With this method, the dislocation density can be reduced to about $10^5$ cm$^{-2}$ to $10^6$ cm$^{-2}$, but the manufacturing process is complicated, which is another problem.

On the other hand, a method of growing crystals from a liquid phase also has been studied as a manufacturing method other than the vapor phase epitaxy. However, since the equilibrium vapor pressure of nitrogen is at least 10000 atm ($10000 \times 1.013 \times 10^5$ Pa) at the melting point of Group III nitride single crystals such as, for instance, GaN or AlN, conventionally it has been understood that a severe condition, specifically, 8000 atm ($8000 \times 1.013 \times 10^5$ Pa) at 1200° C., is required for growing GaN from a liquid phase. In this connection, recently, a method has been developed in which a Na flux is used to allow GaN to be synthesized at relatively low temperature and pressure, specifically, 750° C. and 50 atm ($50 \times 1.013 \times 10^5$ Pa) (see, for instance, U.S. Pat. No. 5,868,837).

Recently, single crystals whose maximum crystal size is about 1.2 mm are obtained by a method in which a mixture of Ga and Na is melted in a nitrogen gas atmosphere containing ammonia at 800° C. and 50 atm ($50 \times 1.013 \times 10^5$ Pa), and then crystals are grown for 96 hours using the melt (see, for instance, JP2002-293696A).

Furthermore, another method has been reported in which a GaN crystal layer is formed on a sapphire substrate by a metalorganic chemical vapor deposition (MOCVD) method and then single crystals are grown by a liquid phase epitaxy (LPE) method (Jpn. J. Appl. Phys., Vol42, (2003) pp4-6).

However, the quality of the Group III nitride crystals obtained using the conventional techniques may not be sufficient. Hence, there are demands for a technique of manufacturing crystals of higher quality. In addition, the methods of manufacturing Group III nitride crystals using the conventional techniques are complicated. Furthermore, there is a problem when the Group III nitride crystals obtained by the conventional techniques are used as a substrate in the semiconductor manufacturing processes.

SUMMARY OF THE INVENTION

With such situations in mind, the present invention is intended to provide Group III nitride crystals that are of high quality, are manufactured efficiently, and are useful and usable as a substrate for semiconductor manufacturing processes, a method of manufacturing the same, and a semiconductor device with the same.

In order to achieve the above-mentioned object, Group ir nitride crystals of the present invention includes: a first layer made of a semiconductor that is expressed by a composition formula of a $Al_sGa_tIn_{1-s-t}N$ (where $0 \leq s \leq 1$, $0 \leq t \leq 1$, and $s+t \leq 1$); a second layer formed on the first layer; and a third layer made of a semiconductor tat is expressed by a composition formula of $Al_uGa_vIn_{1-u-v}N$ (where $0 \leq u \leq 1$, $0 \leq v \leq 1$, and $u+v \leq 1$); and is formed on the second layer by the liquid phase epitaxy method. The Group III nitride crystals of the present invention are characterized in that the second layer includes nitrogen and at least one element selected from the group consisting of gallium, aluminum, and indium, and that the first layer, the second layer, and the third layer each has a crystal structure at least in a part thereof and the defect density of the crystal structure of the second layer is higher than the higher of the defect densities of the first layer and the tbird layer.

The Group III nitride crystals of the present invention can be used as a Group III nitride substrate. That is, the Group III nitride crystals of the present invention may be used as a Group III nitride substrate itself.

The manufacturing method of the present invention is a method of manufacturing the Group III nitride crystals of the present invention and includes the following processes (i), (ii), and (iii):

(i) forming a first layer made of a semiconductor that is expressed by a composition formula of $Al_sGa_tIn_{1-s-t}N$ (where $0 \leq s \leq 1$, $0 \leq t \leq 1$, and $s+t \leq 1$);

(ii) forming a second layer on a surface of the first layer by bringing the surface of the first layer into contact with a melt in an atmosphere including nitrogen, wherein the second layer has a higher defect density than that of the first layer, and the melt includes nitrogen, at least one Group III element selected from the group consisting of gallium, aluminum, and indium, and at least one of alkali metal and alkaline-earth metal; and (iii) forming, on the second layer, a third layer in the melt in an atmosphere including nitrogen, wherein the third layer is made of a semiconductor that is expressed by a composition formula of $Al_uGa_vIn_{1-u-v}N$ (where $0 \leq u \leq 1$, $0 \leq v \leq 1$, and $u+v \leq 1$), and the third layer has a lower defect density than that of the second layer.

A method of manufacturing a Group III nitride substrate according to the present invention is a manufacturing method including a process of growing Group III nitride crystals by the above-mentioned manufacturing method.

As described above, the Group III nitride crystals and the method of manufacturing the same according to the present invention are characterized in that the defect density of the crystalized structure of the second layer is higher than the higher of the defect densities of the first layer and the third layer. That is, since the third layer of the crystals according to the present invention is of excellent quality, a favorable semiconductor layer can be formed thereon. Furthermore, the second layer serves as a distortion alleviation layer and thereby can prevent cracks from being caused in the third layer. As a result, the quality of the third layer can be improved further and the thickness of the third layer can be increased. Moreover, the second layer also serves as a separation layer and thereby allows the third layer to be separated easily. Consequently, the crystals and substrate of the present invention can be used readily in the semiconductor processes.

DETAILED DESCRIPTION OF THE INVENTION

Figure 1A:
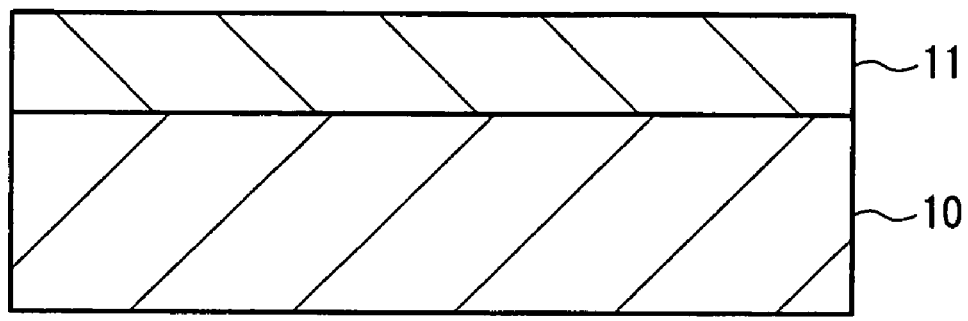
FIGS. 1A and 1B are cross-sectional views showing processes of an example of the manufacturing method according to the present invention.

Hereafter, the present invention is described in detail.

In the present invention, the "defects" are not particularly limited as long as they are defects of a crystal structure. Examples of the "defects" include defects caused by introduction of impurities and crystal lattice defects. The impurities described above include, for instance, those originating from components of the material forming a crucible, a reactor vessel, or other members that are used for producing the crystals, and those originating from components of the material of the melt that is used in the liquid phase method. The crystal lattice defects include, for instance, dislocations (line defects). Examples of the dislocations include edge dislocations and screw dislocations. In the GaN crystals, the crystal lattice defects include, for instance, defects of Ga and N. Of the defects caused in the present invention, the defects caused by the introduction of impurities can be determined by impurity analysis such as, for example, secondary ion mass spectroscopy (SIMS) or optical evaluations such as, for instance, photoluminescence evaluations. The dislocations can be determined, for example, through observation using a transmission electron microscope (TEM).

In the Group III nitride crystals of the present invention, it is preferable that the defect density includes a dislocation density. Preferably, the dislocation density is that of at least one of edge dislocations and screw dislocations. It also is preferable that the second layer has a dislocation density that is at least 100 times higher than those of the first layer and the third layer. More preferably, the second layer has a dislocation density that is 100 times to 1000 times higher than those of the first layer and the third layer. Preferably, the second layer has a dislocation density of at least $10^8$ cm$^{-2}$, more preferably in the range of 108 cm$^{-2}$ to 1010 cm$^{-2}$. It is preferable that the third layer has a dislocation density of higher than zero but not higher than 106 cm$^{-2}$, more preferably in the range of $10^2$ cm$^{-2}$ to $10^6$ cm$^{-2}$, and further preferably in the range of 102 cm$^{-2}$ to $10^5$ cm$^{-2}$.

In the Group III nitride crystals of the present invention, it is preferable that the interface between the first layer and the second layer has a concave-convex shape.

In the Group III nitride crystals of the present invention, it is preferable that the second layer and the third layer are formed by immersing the first layer in a melt to carry out crystal growth in an atmosphere including nitrogen, and the melt contains nitrogen, at least one of alkali metal and alkaline-earth metal, and at least one Group III element selected from the group consisting of gallium, aluminum, and indium.

In the Group III nitride crystals of the present invention, it is preferable that the third layer is formed of gallium nitride (GaN) crystals.

In the Group III nitride crystals of the present invention, it also is preferable that the third layer is formed of aluminum nitride (AlN) crystals.

In the Group III nitride crystals of the present invention, it is preferable that the defect density includes an impurity density. In this case, at least one of the first layer, the second layer, and the third layer may be formed by a liquid phase method using at least one of alkali metal and alkaline-earth metal, and the impurity density may be a density of impurities originating from at least one of the alkali metal and alkaline-earth metal. Furthermore, at least one of the first layer, the second layer, and the third layer may be formed using a crucible, and the impurity density may be a density of impurities originating from at least one component of the material forming the crucible selected from the group consisting of Y (yttrium), Sm (samarium), Zr (zirconium), W (tungsten), B (boron), Ta (tantalum), Si (silicon), C (carbon), and Ce (cerium). Moreover, at least one of the first layer, the second layer, and the third layer may be formed using a reactor vessel, and the impurity density may be a density of impurities originating from at least one component of the material forming the reactor vessel selected from the group consisting of Fe (iron), Ni (nickel), Cr (chromium), Cu (copper), W (tungsten), Ta (tantalum), Y (yttrium), Sm (samarium), Zr (zirconium), B (boron), Si (silicon), C (carbon), and Ce (cerium).

In the Group III nitride crystals of the present invention, it is preferable that a portion of the third layer located on the exposed surface side thereof has an impurity density of higher than zero but not higher than 1 ppm, more preferably higher than zero but not higher than 0.1 ppm, and further preferably higher than zero but not higher than 0.05 ppm.

In the Group III nitride crystals of the present invention, it is preferable that the second layer has an impurity density of at least 100 ppm, more preferably in the range of 100 ppm to 1000 ppm.

In the Group III nitride crystals of the present invention, it is preferable that the first layer is formed on a substrate. In this case, the shape of the first layer is not particularly limited but is preferably a thin film shape. The thickness of the thin film is, for instance, in the range of 0.5 µm to 100 µm, preferably in the range of 2 µm to 20 µm.

The substrate is not particularly limited. The substrate can be, for example, a GaAs substrate whose surface is a (111) plane, a Si substrate whose surface is a (111) plane, a sapphire substrate whose surface is a (0001) plane, or a SiC substrate whose surface is a (0001) plane. Among them, the sapphire substrate and the SiC substrate are preferable.

In the Group III nitride crystals of the present invention, it is preferable that the substrate and the third layer can be separated from each other at any position between one side of the second layer in contact with the first layer and the other side of the second layer in contact with the third layer, and thereby the third layer alone can be used as a substrate for manufacturing a semiconductor.

In the Group III nitride crystals according to the present invention, it is preferable that the third layer satisfies a relationship of N1>N2, where N1 denotes a defect density of its portion located on the second layer side while N2 indicates that of its portion located on the side of its exposed surface. When the defects are impurities, in the third layer, the defect density (N1) of its portion located on the second layer side is, for example, 1 ppm to 10000 ppm, preferably 10 ppm to 1000 ppm while the defect density (N2) of its portion located on the exposed surface side is, for instance, 0.001 ppm to 10 ppm, preferably 0.01 ppm to 1 ppm, and further preferably 0.05 ppm to 0.5 ppm.

In the Group III nitride crystals of the present invention, it is preferable that the defect density includes an impurity density. In this case, the third layer may be formed by a liquid phase method using at least one of alkali metal and alkaline-earth metal, and the impurity density may be a density of impurities originating from at least one of the alkali metal and alkaline-earth metal. Furthermore, the third layer may be formed using a crucible, and the impurity density may be a density of impurities originating from at least one component of the material forming the crucible selected from the group consisting of Y (yttrium), Sm (samarium), Zr (zirconium), W (tungsten), B (boron), Ta (tantalum), Si (silicon), C (carbon), and Ce (cerium). Moreover, the third layer may be formed using a reactor vessel, and the impurity density may be a density of impurities originating from at least one component of the material forming the reactor vessel selected from the group consisting of Fe (iron), Ni (nickel), Cr (chromium), Cu (copper), W (tungsten), Ta (tantalum), Y (yttrium), Sm (samarium), Zr (zirconium), B (boron), Si (silicon), C (carbon), and Ce (cerium).

The impurity density of the portion of the third layer located on the exposed surface side is preferably higher than zero but not higher than 1 ppm, more preferably higher than zero but not higher than 0.1 ppm, and further preferably higher than zero but not higher than 0.05 ppm.

In the Group III nitride crystals of the present invention, it is preferable that the third layer includes a visible-light transmission region and satisfies a relationship of K1>K2, where K1 denotes an absorption coefficient of a part of the visible-light transmission region located on the second layer side and K2 indicates that of a part of the visible-light transmission region located on the side of the exposed surface of the third layer. In this case, the absorption coefficient (K2) of the part of the visible-light transmission region located on the exposed surface side of the third layer is preferably higher than zero but not higher than 100 per cm, more preferably higher than zero but not higher than 10 per cm, and further preferably higher than zero but not higher than 5 per cm. The absorption coefficient can be determined by, for example, measuring transmittances of a sample at respective wavelengths with, for instance, a spectrophotometer, and using the transmittances thus obtained and the thickness of the sample.

The semiconductor device of the present invention is formed using a Group III nitride substrate, wherein the Group III nitride substrate is the Group III nitride crystals of the present invention. The type of semiconductor device of the present invention is not particularly limited. The semiconductor device may be, for instance, a laser diode or a light emitting diode.

In the manufacturing method of the present invention, it is preferable that the defect density includes a dislocation density. Preferably, the dislocation density is that of at least one of edge dislocations and screw dislocations. The dislocation density of the second layer is preferably at least 100 times higher than those of the first layer and the third layer, more preferably 100 times to 1000 times higher than those of the first layer and the third layer. The dislocation density of the second layer is preferably at least $10^8$ cm$^{-2}$, more preferably in the range of $10^8$ cm$^{-2}$ to $10^{10}$ cm$^{-2}$. The dislocation density of the third layer is preferably higher than zero but not higher than $10^6$ cm$^{-2}$, more preferably in the range of 10 cm$^{-2}$ to $10^6$ cm$^{-2}$, and further preferably in the range of $10^2$ cm$^{-2}$ to $10^5$ cm$^{-2}$.

Preferably, in the process (ii) of the manufacturing method according to the present invention, the melt is changed from an unsaturation state into a supersaturation state, and in the process (iii), the melt is in the supersaturation state. In this case, it is preferable that in the process (ii), at least a part of the surface of the first layer is melted by the melt that is in the unsaturation state, and thereafter the second layer is formed thereon.

In the manufacturing method of the present invention, the type of the third layer is not particularly limited, but it is preferable that a gallium nitride (GaN) crystal layer is formed as the third layer. It also is preferable that an aluminum nitride (AlN) crystal layer is formed as the third layer.

In the manufacturing method of the present invention, it is preferable that the atmospheres including nitrogen employed in the processes (ii) and (iii) each are a pressurized atmosphere. The pressure condition is, for instance, 1 atm ($1 \times 1.013 \times 10^5$ Pa) to 500 atm ($500 \times 1.013 \times 10^5$ Pa), preferably 3 atm ($3 \times 1.013 \times 10^5$ Pa) to 100 atm ($100 \times 1.013 \times 10^5$ Pa). The pressures that are required in the processes (ii) and (iii) may be equal to each other or may be different from each other.

In the process (i) of the manufacturing method according to the present invention, it is preferable that the first layer is formed on a substrate. In this case, the shape of the first layer is not particularly limited but is preferably a thin film shape. The thickness of the thin film is, for example, in the range of 0.5 μm to 100 μm, preferably in the range of 2 μm to 200 μm.

The substrate is not particularly limited. However, the substrate can be, for example, a GaAs substrate whose surface is a (111) plane, a Si substrate whose surface is a (111) plane, a sapphire substrate whose surface is a (0001) plane, or a SiC substrate whose surface is a (0001) plane. Among them, the sapphire substrate and the SiC substrate are preferable.

It is preferable that the manufacturing method of the present invention further includes, after the process (iii), a process (iv) of separating the substrate and the third layer from each other at any position between one side of the second layer in contact with the first layer and the other side of the second layer in contact with the third layer. The process (iv) is not particularly limited but is preferably a process of irradiating the second layer with light.

In the manufacturing method of the present invention, it is preferable that the process (ii) is a process of forming a gallium nitride (GaN) layer as the second layer, the melt includes gallium and sodium, and the process (ii) is carried out initially at a pressure of less than a minimum pressure P(atm ($P \times 1.013 \times 10^5$ Pa)) that is required for generating GaN crystals at a temperature (T° C.) of the melt, and then at a pressure of higher than the minimum pressure P(atm ($P \times 1.013 \times 10^5$ Pa)) In this case, it is preferable that the temperature of the melt is in the range of 600° C. to 950° C., and the minimum pressures P that is required for generating GaN crystals at various temperatures (T° C.) of the melt are as follows:

| Mixed Melt Temperature T (° C.) | Minimum Pressure P required for generating GaN Crystals (atm (P × 1.013 × 10⁵ Pa)) |
| --- | --- |
| 600 | 50 |
| 700 | 5 |
| 750 | 5 |
| 800 | 10 |
| 850 | 15 |
| 880 | 25 |
| 900 | 40 |
| 950 | 70 |

In the process (iii) of the manufacturing method according to the present invention, it is preferable that a growth rate at which the third layer grows in the thickness direction is reduced stepwise or continuously. In addition, a growth rate at which the second layer grows also may be changed as in the case of the third layer. The growth rate may be, for example, 1 μm/hr to 50 μm/hr, preferably 5 μm/hr to 25 μm/hr. In this case, the growth rate varies with, for instance, a heating condition, a pressure condition, a stirring condition, a flux component, a crucible shape, and the area of the portion that comes into contact with the ambient gas. For example, in order to obtain a high growth rate, it may be advantageous to promote the melting of nitrogen into the melt by stirring, to use a mixed flux such as one made of Na and Ca having high nitrogen solubility, and to increase the area of the portion that comes into contact with the ambient nitrogen gas. The rate at which the growth rate is decreased is not particularly limited. For instance, the rate may be a minimum of 1 μm/hr to 100 μm/hr and a maximum of 20 μm/hr to 500 μm/hr, preferably a minimum of 5 μm/hr to 70 μm/hr and a maximum of 30 μm/hr to 300 μm/hr, and further preferably a minimum of 10 μm/hr to 50 μm/hr and a maximum of 50 μm/hr to 100 μm/hr. The ratio (the minimum/the maximum) at which the growth rate is decreased is, for instance, 1% to 99%, preferably 20% to 90%, and further preferably 30% to 80%. The method of decreasing the growth rate is not particularly limited. However, preferable methods include, for example, raising the growth temperature and reducing the growth pressure. Specifically, the growth rate may be decreased as follows.

In the process (iii), it is preferable that while the pressure Pi (atm ($P1 \times 1.013 \times 10^5$ Pa)) of the pressure condition is kept constant, the temperature (T°0 C.) of the mixed melt is changed stepwise or continuously, and more preferably, is raised stepwise or continuously. That is, the growth rate can be controlled by changing the temperature (T° C.) of the mixed melt under the constant pressure condition. As a result, GaN crystals can grow in the melt under the conditions that can lessen the occurrence of defects and the introduction of impurities. Consequently, GaN crystals with higher transparency can be obtained. The range in which the temperature (T° C.) of the mixed melt is changed at various pressures P1 (atm ($P1 \times 1.013 \times 10^5$ Pa)) is, for instance, that indicated in the following table.

| Pressure P1 under Pressure Condition (atm (P1 × 1.013 × 10⁵ Pa)) | Temperature T of Mixed Melt (° C.) |
| --- | --- |
| 20 | 700 to 850 |
| 30 | 700 to 900 |
| 40 | 700 to 930 |

When being changed stepwise, the temperature may be changed at two stages or more. When being changed continuously, the temperature (T° C.) may be changed preferably at a rate of, for example, 0.1° C./hr to 10° C./hr, more preferably 0.5° C./hr to 5° C./hr.

In the process (iii), while the temperature (T° C.) of the mixed melt is kept constant, the pressure P1 (atm ($P1 \times 1.013 \times 10^5$ Pa)) of the pressure condition preferably is changed stepwise or continuously, and more preferably is reduced stepwise or continuously. That is, when the pressure P1 (atm ($P1 \times 1.013 \times 10^5$ Pa)) of the pressure condition is changed at a constant temperature, the growth rate can be controlled. As a result, GaN crystals can grow in the melt under the conditions that can lessen the occurrence of defects and the introduction of impurities. Consequently, GaN crystals with higher transparency can be obtained. In this case, the pressure P1 (atm (P1×1.013×10⁵ Pa)) of the pressure condition is, for example, in the range expressed by the following conditional expression (I), preferably in the range expressed by the following conditional expression (II).

$$P \leq P1 \leq (P+45) \quad (I)$$

$$(P+5) \leq P1 \leq (P+15) \quad (II)$$

In the conditional expression (I), P(atm (P×1.013×10⁵ Pa)) denotes a minimum pressure that is required for generating GaN crystals at a temperature (T° C.) of the mixed melt.

When being changed stepwise, the pressure P1 (atm (P1×1.013×10⁵ Pa)) may be changed at two stages or more. When being changed continuously, the pressure P1 (atm (P1×1.013×10⁵ Pa)) may be changed preferably, for example, at a rate of 0.01 atm (0.01×1.013×10⁵ Pa)/hr to 1 atm (1×1.013×10⁵ Pa)/hr, more preferably at a rate of 0.05 atm (0.05×1.013×10⁵ Pa)/hr to 0.3 atm (0.3×1.013×10⁵ Pa)/hr.

Hereinafter, the present invention is described using examples with suitable reference to the drawings but is not limited by the following examples. In the following examples, the Group III nitride crystals of the present invention are used as a substrate. The present invention, however, is not limited to the following examples.

EMBODIMENT 1

In this method, first, a first layer 11 is formed by a vapor growth method (step (i)). The first layer 11 is made of semiconductor crystals that are expressed by a composition formula of $Al_sGa_tIn_{1-s-t}N$ (where $0 \leq s \leq 1$, $0 \leq t \leq 1$, and $s+t \leq 1$). As shown in FIG. 1A, the first layer 11 is formed on a substrate 10. Examples of the substrate 10 include a sapphire substrate (whose surface is, for example, a (0001) plane), a GaAs substrate (whose surface is, for example, a (111) plane), a Si substrate (whose surface is, for example, a (111) plane), and a SiC substrate (whose surface is, for example, a (0001) plane). The first layer 11 is a seed layer to serve as seed crystals. The first layer 11 is made of, for instance, GaN or $Al_sGa_{1-s}N$. Such a semiconductor layer can be formed by a vapor growth method such as a metalorganic chemical vapor deposition (MOCVD) method, a molecular beam epitaxy (MBE) method, or a hydride vapor phase epitaxy (HVPE) method. The thickness of the first layer 11 is not particularly limited but can be, for example, about 0.5 μm to 20 μm. The dislocation density of the first layer is about 5×10⁸ cm⁻². However, when using, for example, the ELOG growth method, the dislocation density of the crystals to be formed can be about 10⁵ cm⁻² to 10⁶ cm⁻².

In the above, the description was directed to the example in which the first layer is formed on the substrate. It, however, also is possible to use a first layer alone that is expressed by a composition formula of $Al_sGa_tIn_{1-s-t}N$ (where $0 \leq s \leq 1$, $0 \leq t \leq 1$, and $s+t \leq 1$). Such a first layer can be formed using, for instance, the IWPE method. First, a GaN layer is formed on a sapphire substrate by the MOCVD method. Next, a Ti film is formed thereon and then is heat-treated with NH₃. Thus a TiN film with voids is formed. GaN crystals with a thickness of, for example, 600 μm then are formed on the TiN film by the HVPE method. Thereafter, the GaN crystals are separated from the sapphire substrate. As a result, a self-supporting substrate formed of the GaN layer (the first layer) alone can be obtained.

Furthermore, the first layer mentioned above may be formed not only through vapor phase epitaxy but also liquid phase epitaxy. The method thereof can be, for instance, that to be used for forming a second layer or a third layer described later.

Next, a second layer 12 with a higher dislocation density than that of the first layer 11 is formed on the surface of the first layer 11 in an atmosphere (preferably a pressurized atmosphere of 100 atm (100×1.013×10⁵ Pa) or lower) including nitrogen by bringing the surface of the first layer 11 into contact with a melt (step (ii)). The melt contains: at least one Group III element selected from gallium, aluminum, and indium; and at least one of alkali metal and alkaline-earth metal. Generally, the dislocation density of the second layer 12 is at least 10⁸ cm⁻² (preferably, 10⁹ cm⁻² to 10¹⁴ cm⁻²). It is preferable that the second layer 12 has a dislocation density that is at least 100 times higher than those of the first layer 11 and a third layer 13 to be formed at step (iii) described below. Generally, the dislocation densities of the first layer 11 and the third layer 13 are 10⁹ cm⁻² or lower and 10⁷ cm⁻² or lower, respectively. Preferably, the dislocation density of the first layer 11 and that of the third layer 13 each are different from that of the second layer 12 by at least 100 times. As described later, defects that are found in the first, second, and third layers may be caused by the introduction of impurities.

Figure 1B:
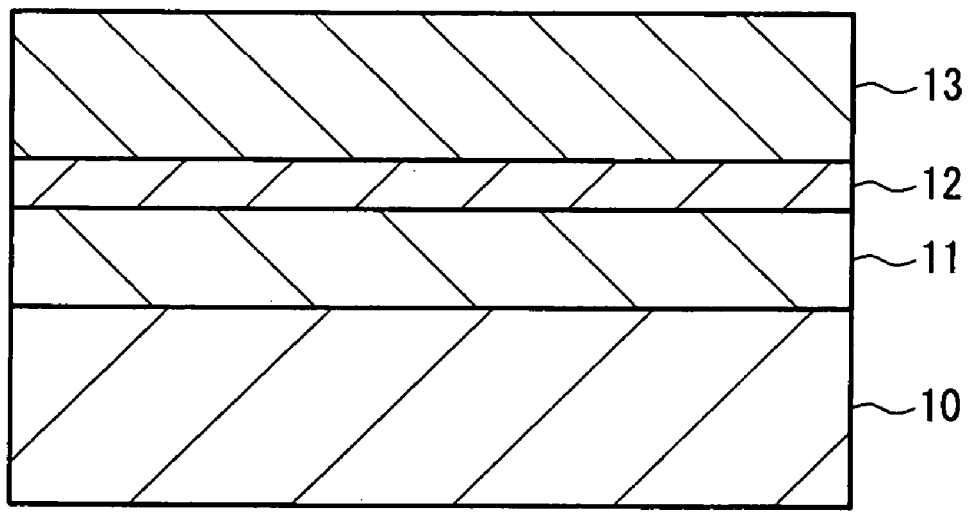

Next, in the atmosphere (preferably a pressurized atmosphere of 100 atm (100×1.013×10⁵ Pa) or lower) including nitrogen, semiconductor crystals are grown on the second layer 12 in the melt to form the third layer 13 (step (iii)). The semiconductor crystals are expressed by a composition formula of $Al_uGa_vIn_{1-u-v}N$ (where $0 \leq u \leq 1$, $0 \leq v \leq 1$, and $u+v \leq 1$). The third layer 13 formed by the liquid phase epitaxy method has a lower dislocation density than that of the second layer 12. Thus, as shown in FIG. 1B, the first layer 11, the second layer 12, and the third layer 13 are stacked together.

The atmospheres including nitrogen employed in steps (ii) and (iii) can be, for instance, one including nitrogen gas or ammonia gas. It is preferable that the melt contains one of alkali metal and alkaline-earth metal or both of them. Examples of the alkali metal include sodium, lithium, potassium, rubidium, and cesium. They may be used individually, or two or more of them may be used together. Examples of the alkaline-earth metal include Ca, Mg, Sr, Ba, and Be. They may be used individually, or two or more of them may be used together. Furthermore, a mixture of alkali metal and alkaline-earth metal may be used. When AlN crystals are to be grown, for instance, a melt of Ca can be used. Generally, the alkali metal and alkaline-earth metal serve as a flux.

The melt used in steps (ii) and (iii) is prepared by, for instance, placing a material in a crucible and then heating it. After being prepared, the melt is brought into a supersaturation state and thereby semiconductor crystals grow. The melting of the material and the crystal growth are carried out, for instance, at a temperature of about 700° C. to 1100° C. and a pressure of around.1 atm (1×1.013×10⁵ Pa) to 100 atm (100×1.013×10⁵ Pa).

The step (iii) can be carried out successively after the step (ii). That is, the step (iii) can be carried out with the first layer 11, which has been brought into contact with the melt in the step (ii), being in contact with the melt (in the same atmosphere as in the step (ii)). For instance, the second layer 12 can be formed by initially using a melt that is in an unsaturation state in the step (ii) and then changing the melt into the supersaturation state. Subsequently, crystals are made to grow using the supersaturated melt and thereby the third layer 13 can be formed. The first layer 11 that has come into contact with the unsaturated melt is melted partly, and thereby the second layer 12 with a higher dislocation density is formed. Furthermore, the third layer 13 with a lower dislocation density is formed on the second layer 12 that is in contact with the supersaturated melt.

The second layer 12 may contain a high ratio of impurities. Examples of the impurities that may be contained in the second layer include alkali metal and alkaline-earth metal contained in the melt, and materials of the crucible or a reactor vessel that react with the melt or vapor thereof. The second layer 12 can be formed by other methods. For instance, the second layer 12 with many defects may be formed through crystal growth that is carried out in a supersaturated melt at a high growth rate.

As mentioned before, the second layer also serves as a distortion alleviation layer. For example, in the case where a GaN first layer is formed on a sapphire substrate and then GaN crystals are grown thereon from a liquid phase, the GaN crystals are distorted due to the difference in coefficient of linear expansion between the substrate and the GaN crystals when the GaN crystals are cooled to a room temperature after having been grown at a high temperature. Accordingly, when thick GaN crystals whose thickness is at least 100 sum are grown, there is a high possibility that cracks may be caused therein. In this case, since the second layer contains a high density of impurities, the distortion caused by the difference in coefficient of linear expansion between the sapphire crystals and the GaN crystals can be alleviated. The third layer may be separated partially using the distortion caused between the second layer and third layer since the second layer contains a high density of impurities.

Furthermore, when the second layer is irradiated with light, the substrate can be separated easily. There is a method using light (the third harmonic of Nd:YAG, 355 nm) whose wavelength is longer than the absorption coefficient of the sapphire substrate but shorter than that (370 nm) of GaN, to separate the sapphire substrate and the GaN substrate from each other by thermal decomposition to which the interface therebetween is subjected. However, the use of the second layer allows the substrate to be separated through an irradiation with light at lower power or light in the visible region and thus the substrate can be separated more easily.

In the method described above, the GaN crystals are obtained by using, for instance, gallium alone as the Group III element that is contained in the material, while the crystals that are expressed by a composition formula of $Al_uGa_{1-u}N$ (where $0 \leq u \leq 1$) are obtained by using gallium and aluminum as the Group III element that are contained in the material. The Group III nitride crystals (the third layer) that is formed by the above-mentioned method has a very low dislocation density and high crystallinity. As described in Embodiment 2 below, the formation of a semiconductor device may follow the production of the substrate according to Embodiment 1.

The substrate formed by the method described above is a Group III nitride substrate of the present invention. The substrate includes, as shown in FIG. 1B: the first layer 11 formed on the substrate 10; the second layer 12 formed on the first layer 11; and the third layer 13 formed on the second layer 12. The first layer 11 is formed of semiconductor crystals that are expressed by a composition formula of $Al_sGa_tIn_{1-s-t}N$ (where $0 \leq s \leq 1$, $0 \leq t \leq 1$, and $s+t \leq 1$). The second layer 12 contains nitrogen and at least one element selected from Al, Ga, and In and has a dislocation density of, for instance, at least $10^8$ cm$^{-2}$ (preferably, $10^9$ cm$^{-2}$ to $10^{14}$ cm$^{-2}$). The third layer 13 is formed of semiconductor crystals that are formed by the liquid phase epitaxy method and are expressed by a composition formula of $Al_uGa_vIn_{1-u-v}N$ (where $0 \leq u \leq 1$, $0 \leq v \leq 1$, and $u+v \leq 1$). The second layer 12 has a higher dislocation density than those of the first layer 11 and the third layer 13.

EMBODIMENT 2

A semiconductor device of the present invention is described in Embodiment 2. The semiconductor device of the present invention is one formed using the Group III nitride substrate described in Embodiment 1. That is, the semiconductor device of Embodiment 2 is formed using the Group III nitride crystal layer (for instance, a gallium nitride crystal layer) included in the Group III nitride substrate of Embodiment 1. The present invention is applied to any semiconductor devices that are formed using a Group III nitride substrate, for instance, laser diodes, light emitting diodes, and transistors. Specific examples of such semiconductor devices are described in the examples below.

The present invention is described further in detail using following examples. The following examples are described using GaN crystals as an example. However, Group III nitride crystals that are expressed by a composition formula of $Al_xGa_yIn_{1-x-y}N$ (where $0 \leq x \leq 1$, $0 \leq y \leq 1$, and $x+y \leq 1$) such as $Al_xGa_{1-x}N$ and AlN also can be formed by the same method. In the following examples, the Group III nitride crystals of the present invention are used as the substrate. The present invention, however, is not limited to the following examples.

EXAMPLE 1

In this example, the Group III nitride semiconductor substrate is produced as an example by the method described in Embodiment 1.

Figure 2:
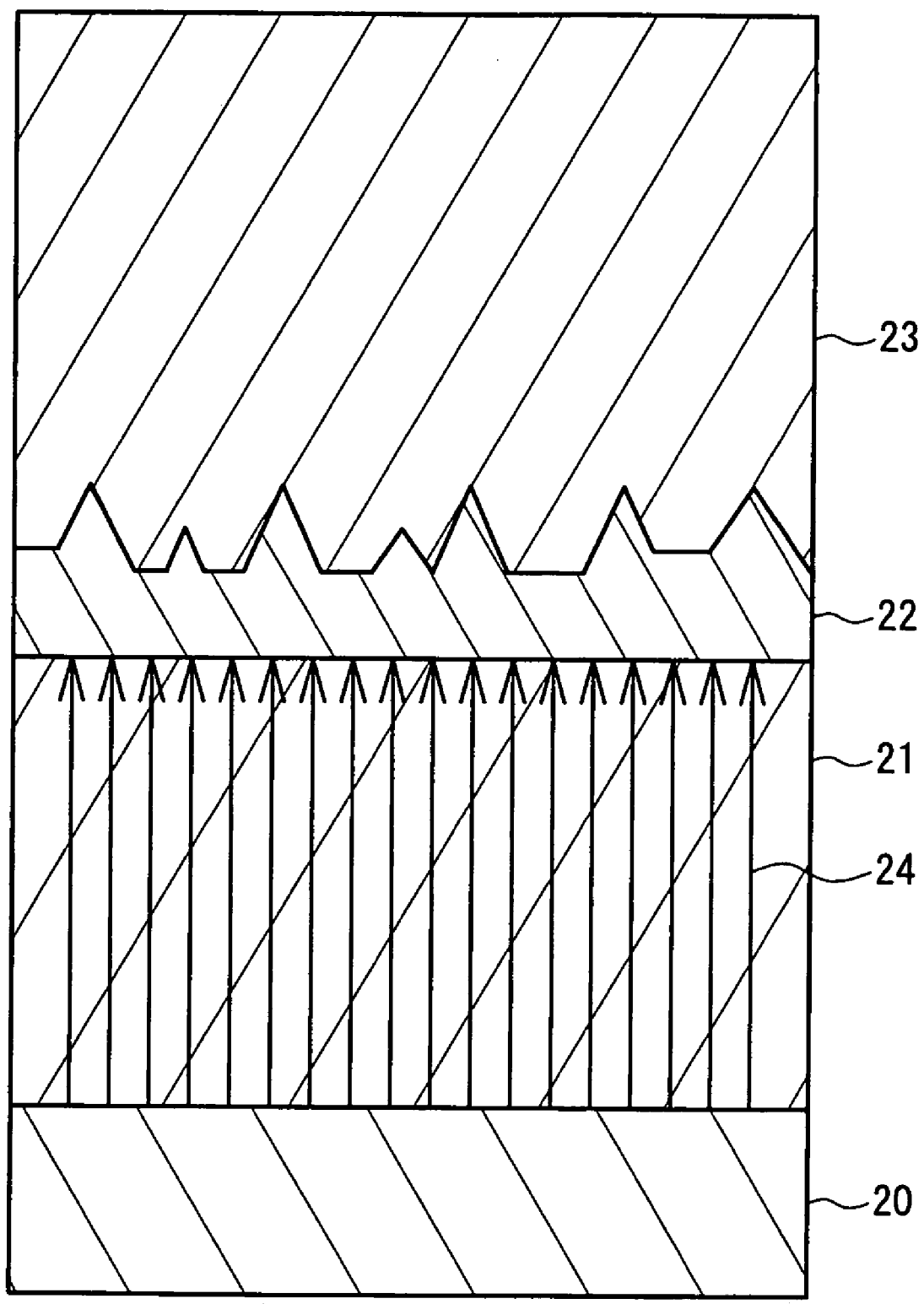
FIG. 2 is a cross-sectional view showing the configuration of an example of the Group III nitride substrate according to the present invention.

The Group III nitride substrate formed in this example has a configuration shown in FIG. 2. The Group III nitride substrate of the present example includes: a sapphire substrate 20 (corresponding to the substrate 10 shown in FIG. 1) made of sapphire (crystalline $Al_2O_3$); a seed layer 21 (the first layer) made of GaN; a high defect layer 22 (the second layer); and an LPE-GaN layer 23 (the third layer) formed by the liquid phase epitaxy method. The seed layer 21 is formed of a Group III nitride that is expressed by a composition formula of $Al_sGa_tIn_{1-s-t}N$ (where $0 \leq s \leq 1$, $0 \leq t \leq 1$, and $s+t \leq 1$). In FIG. 2, the arrows 24 indicate edge dislocations.

The high defect layer 22 is formed in a melt containing alkali metal and at least one Group III element selected from gallium, aluminum, and indium. The present example is characterized in that the LPE-GaN layer 23 is formed on the seed layer 21, with the high defect layer 22 being interposed therebetween. In this substrate, the edge dislocations of the seed layer 21 are reduced by the high defect layer 22. Accordingly, the LPE-GaN layer 23 grown from the high defect layer 22 can have considerably fewer dislocations.

Figure 9A:
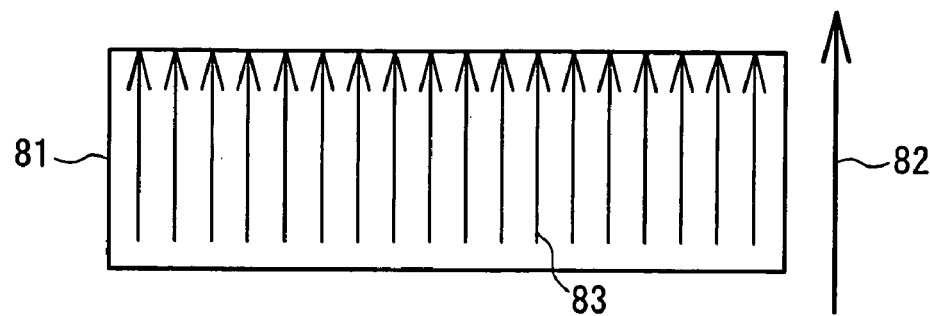
FIGS. 9A to 9C are diagrams showing states in which a second layer is formed on a first layer in another example of the manufacturing method of the present invention.
Figure 9B:
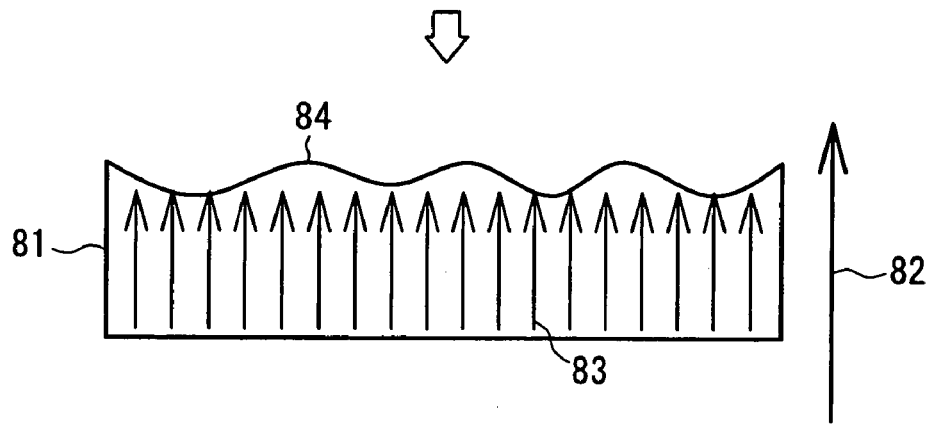
Figure 9C:
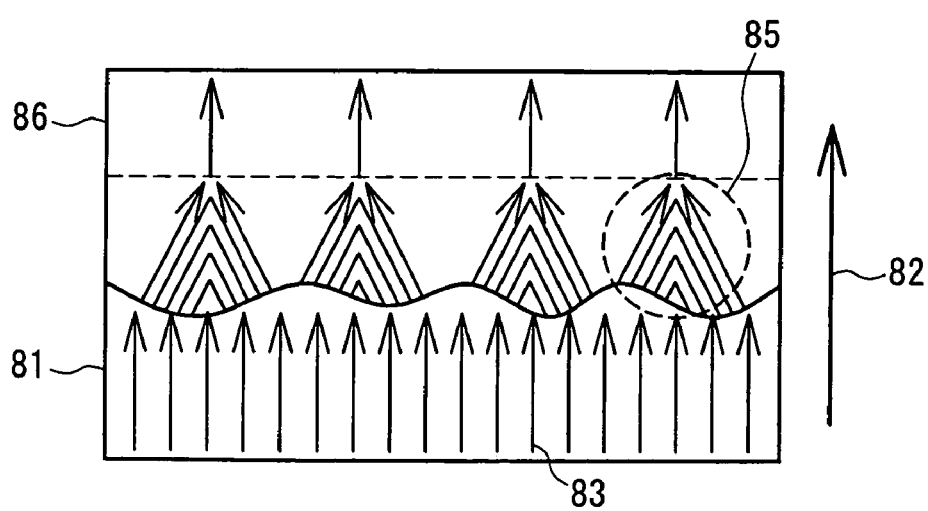

The mechanism thereof is described with reference to FIGS. 9A to 9C. As shown in FIG. 9A, the seed substrate 81 formed of GaN crystals has a number of edge dislocations as indicated with arrows 83. In FIGS. 9A to 9C, the arrow 82 indicates the C-axis direction. When this substrate 81 is immersed in an unsaturated Ga—Na—N melt, the surface of the substrate 81 is subjected to melt backing and thereby a concave-convex melt-back surface 84 is formed. Next, with the melt changed into the state where the GaN of the Ga—Na—N has been supersaturated, a GaN layer 86 grows from a liquid phase on the melt-back surface 84. At this stage, as shown in FIG. 9B, the melt-back surface 84 is rough and is an undulated surface with concavities and convexities. Accordingly, the crystals grown thereon include dense dislocation portions (portions with a large number of dislocations) 85 in parts of the crystals grown at the beginning. However, the dislocations are cancelled in the parts. Hence, a layer with a smaller number of dislocations is formed thereon. Thus, the formation of the melt-back surface 84 contributes to the reduction in the number of dislocations to be caused in the GaN crystals formed thereon.

The following description is directed to a method of manufacturing the above-mentioned Group III nitride substrate. First, the sapphire substrate 20 is heated to a temperature of about 1020° C. to 1100° C. Subsequently, trimethylgallium (TMG) and $NH^3$ are supplied onto the substrate. Thus, the seed layer 21 of GaN is formed.

Figure 10:
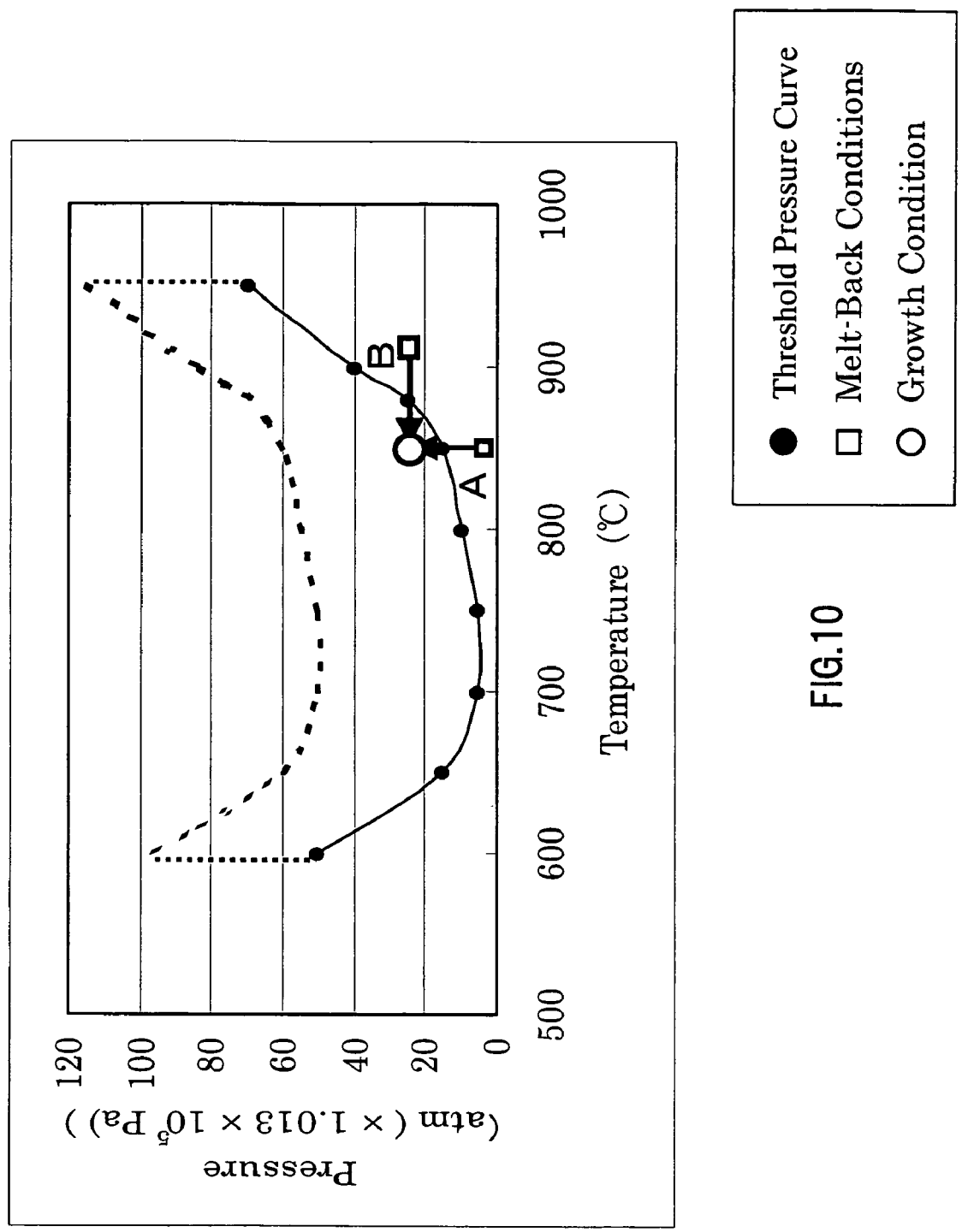
FIG. 10 is a graph showing a threshold pressure curve obtained in still another example of the manufacturing method according to the present invention.

Next, the high defect layer 22 and the LPE-GaN layer 23 are formed in a GaN melt. First, in a nitrogen atmosphere (preferably a pressurized atmosphere of 100 atm (100× $1.013×10^5$ Pa) or lower), the surface of the seed layer 21 is brought into contact with a melt including gallium and Na. The high defect layer 22 can be formed by raising the temperature of the melt to a temperature that is higher than the growth temperature of the LPE-GaN layer 23 and then lowering it to the growth temperature. In another method, the high defect layer 22 can be formed as follows. That is, the pressure of nitrogen gas to serve as the ambient gas is set at a lower pressure than that satisfying the conditions required for growing the LPE-GaN layer 23 and then is increased to a higher pressure. In other words, the seed layer is melted with the unsaturated melt and then the melt is brought into the supersaturation state to allow the GaN layer to grow. Thus, the high defect layer 22 can be formed. Subsequently, the melt is maintained in the supersaturation state continuously and thereby the LPE-GaN layer 23 is grown on the high defect layer 22. This is described with reference to FIG. 10. FIG. 10 is a graph showing the minimum pressures (threshold pressures) required for generating the GaN crystals, conditions required for growing the same, and the conditions required for the melt backing of the same. In FIG. 10, the curve indicated with the symbols "●" shows the minimum pressures (threshold pressures) required for generating GaN crystals at various growth temperatures. This curve was obtained as follows. That is, first, 1 g of sodium and 0.88 g of gallium (the mole ratio: Ga/(Ga+Na)=27%) were weighed in a glove box, the inside of which had been subjected to nitrogen substitution, and then they were placed inside a BN crucible. The crucible was placed in a pressure- and heat-resistant container made of stainless steel. This then was set in an electric furnace. The ambient pressure and growth temperature were controlled with a pressure regulator and the electric furnace. The temperature was raised from the room temperature to the growth temperature in one hour, was maintained at the growth temperature for 96 hours, and then was lowered from the growth temperature to the room temperature in one hour. In this case, the growth temperature was set in the range of 600° C. to 900° C. The growth of crystals was determined through the observation of heterogeneous nucleation caused on the side wall of the BN crucible. The results were plotted corresponding to the temperature and pressure. Thus, the graph shown in FIG. 10 was obtained.

In the graph shown in FIG. 10, the symbols "□" indicate that the melt is in the unsaturation state. The seed layer is immersed in the unsaturated melt and thereby the surface of the seed layer can be melted. Subsequently, as shown with the arrows, the change in ambient pressure or temperature of the melt allows the melt to be brought into the supersaturation state to obtain the condition required for growing the crystals. In FIG. 10, the symbol "o" indicates the supersaturated condition. Under this condition, the crystal growth is promoted. The increase in pressure as shown with the arrow A or the decrease in growth temperature as shown with the arrow B allows the melt-back condition (the state indicated with the symbol "□" in FIG. 10) to be brought into the supersaturation state (the state indicated with the symbol "o" in FIG. 10).

Figure 3:
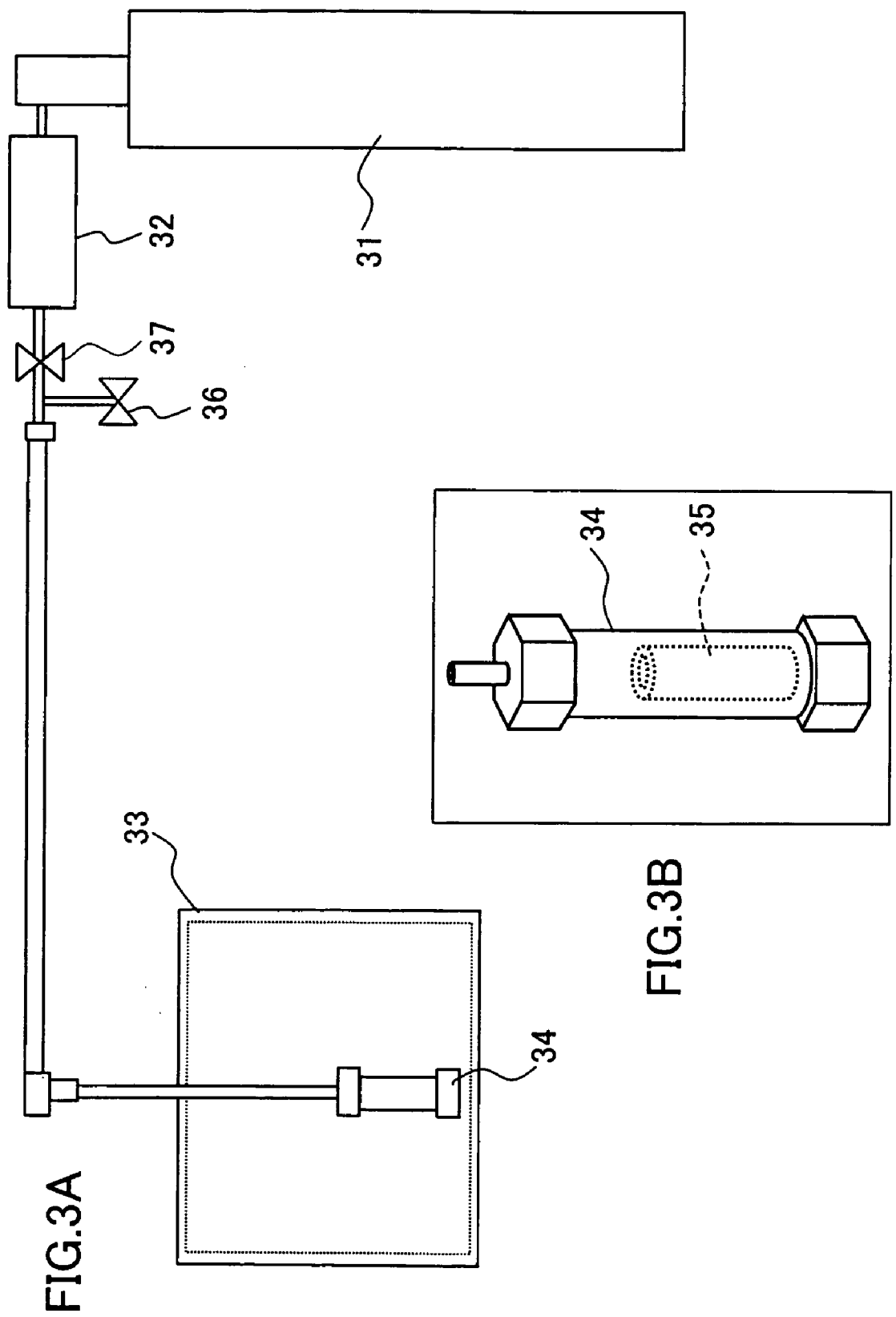
FIG. 3 is a schematic view showing the configuration of an example of manufacturing apparatus to be used in the manufacturing method of the present invention.

FIG. 3 shows a schematic view of an example of the LPE apparatus to be used for growing crystals. The LPE apparatus 30 shown in FIG. 3 includes: a raw material gas tank 31 for supplying nitrogen gas or a mixed gas containing ammonia gas ($NH_3$ gas) and nitrogen gas, as a raw material gas; a pressure regulator 32 for regulating the pressure of a growth atmosphere; and an electric furnace 33. In FIG. 3, numeral 36 indicates a leakage valve, while numeral 37 denotes a switching valve for allowing and stopping gas inflow. The addition of ammonia to the ambient gas allows the ambient pressure to be low during crystal growth. The ammonia, however, is not always necessary to be added. Even in the nitrogen gas atmosphere to which no ammonia is added, crystals can be grown under a pressure of 50 atm (50×$1.013×10^5$ Pa) or lower. A stainless steel container 34 to serve as a growth furnace is placed inside the electric furnace 33. A crucible 35 is set inside the stainless steel container 34. The crucible 35 is made of, for instance, boron nitride (BN) or alumina ($Al_2O_3$). The temperature inside the electric furnace 33 can be controlled within the range of 600° C. to 1000° C. The gas that is supplied from the raw material gas tank 31 has a pressure of, for instance, 100 atm (100×$1.013×10^5$ Pa) to 150 atm (150×$1.013×10^5$ Pa). The ambient pressure can be controlled within the range of not higher than 100 atm (100×$1.013×10^5$ Pa) with the pressure regulator 32.

The production of a Group III nitride substrate using the LPE apparatus 30 shown in FIG. 3 can be carried out, for instance, as follows. First, normal amounts of Ga and Na to serve as a flux are weighed and they are set inside the crucible 35 together with a seed crystal substrate. For instance, Ga and Na may be weighed to have the same weight and then they may be set inside the crucible 35. Subsequently, the crucible 35 is kept at 800° C. and nitrogen gas is supplied at a pressure of 5 atm (5×$1.013×10^5$ Pa). In this stage, the GaN melt is in the unsaturation state. Accordingly, the seed layer of the seed crystal substrate melts. Thereafter, the pressure is increased to and kept at 40 atm (40×$1.013×10^5$ Pa) and then LPE growth was carried out for 10 hours. This is the operation for increasing the pressure as shown with the arrow A in FIG. 10.

Figure 4:
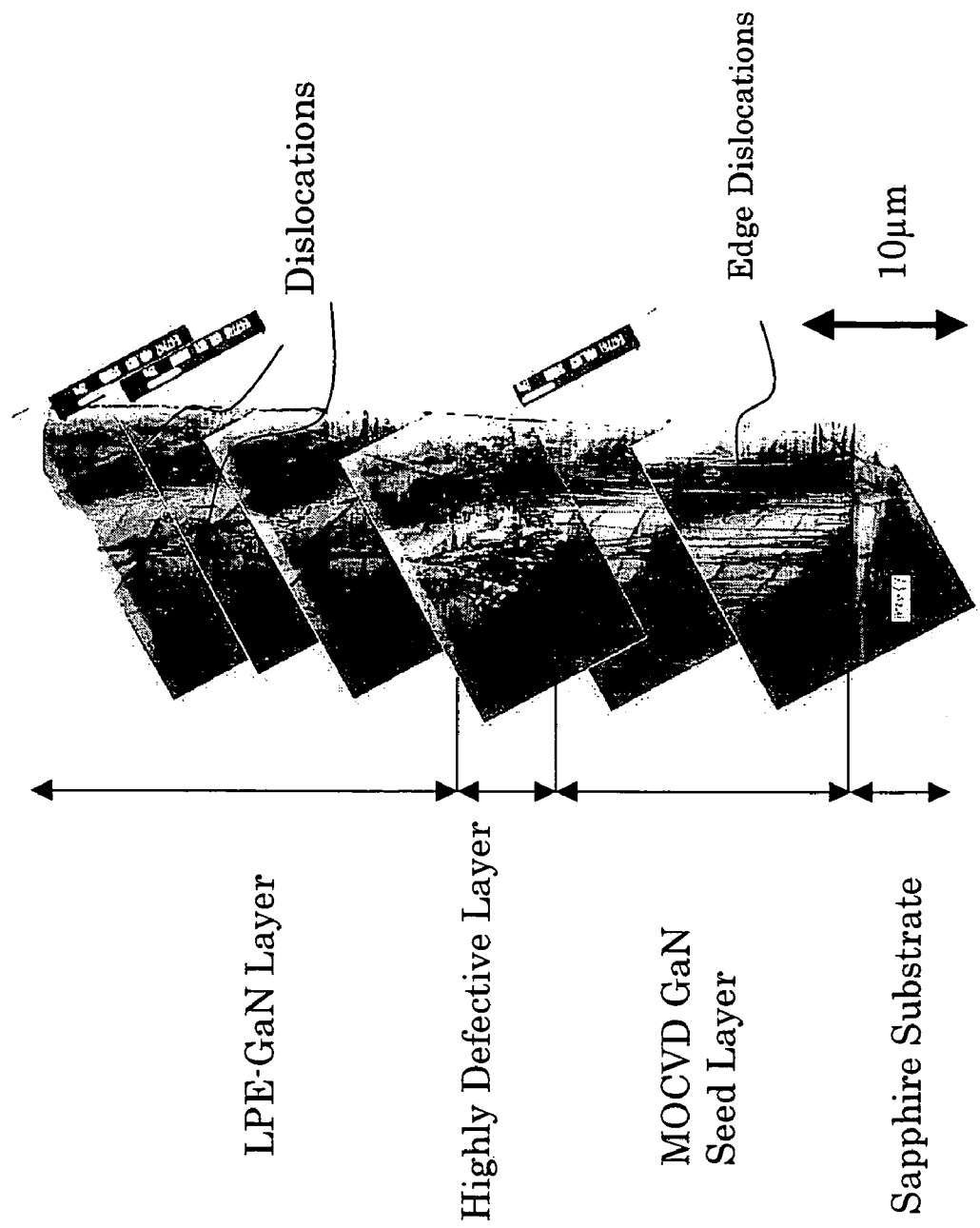
FIG. 4 is a cross-sectional transmission electron microscope (TEM) image of an example of the Group III nitride substrate manufactured by the manufacturing method according to the present invention.

Interfaces of GaN single crystals thus produced were observed with a transmission electron microscope (TEM). A picture of the image thereof is shown in FIG. 4. As shown in FIG. 4, the GaN seed layer (with a thickness of 18 μm) formed by the MOCVD method is present on the sapphire substrate. In this GaN seed layer, edge dislocations caused in the direction perpendicular to the substrate surface were observed. This part had a dislocation density of about 5×10$^8$ cm$^{-2}$. On the other hand, screw dislocations were observed in the LPE-GaN layer formed by the liquid phase epitaxy. This part had a dislocation density of about $10^4$ cm$^{-2}$.

Figure 5:
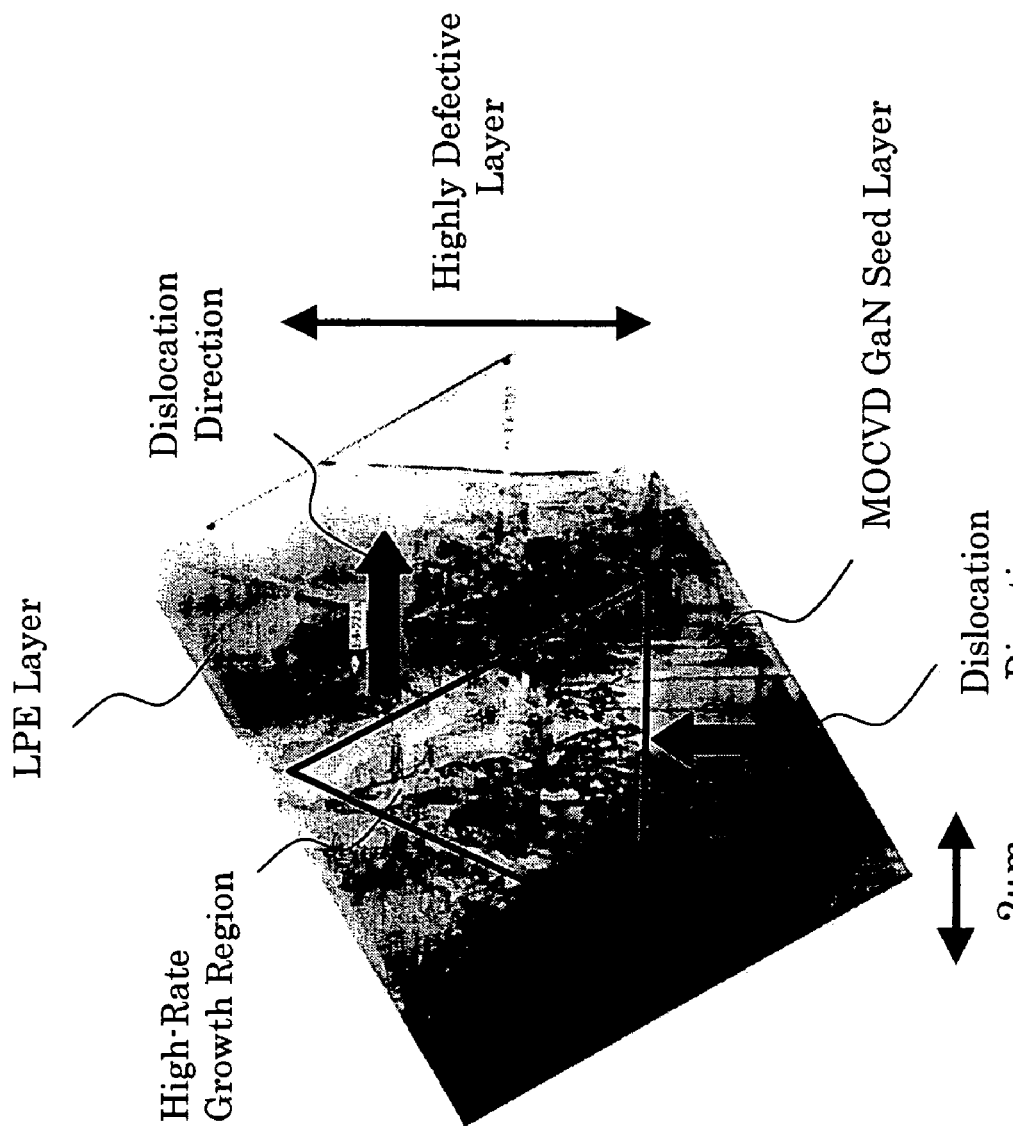
FIG. 5 is an enlarged partial view of the cross-sectional TEM image.

As shown in FIG. 4, a high defect layer was formed between the seed layer and the LPE-GaN layer. This part was a layer that was formed as follows. That is, the surface of the seed layer was melted by the melt and then crystals regrew to form the layer. FIG. 5 shows a cross-sectional TEM image of the highly defective layer. The high defect layer included a triangular high-rate growth region formed therein and dislocations were formed in the transverse direction therefrom. This part had a dislocation density of about $10^{11}$ cm$^{-2}$. The edge dislocations that were present in the GaN seed layer were not reflected in the portion of the LPE-GaN layer located above the dislocations formed in the transverse direction. This made it possible to considerably reduce the number of dislocations to be present in the LPE-GaN layer.

Figures 11A, 11B:
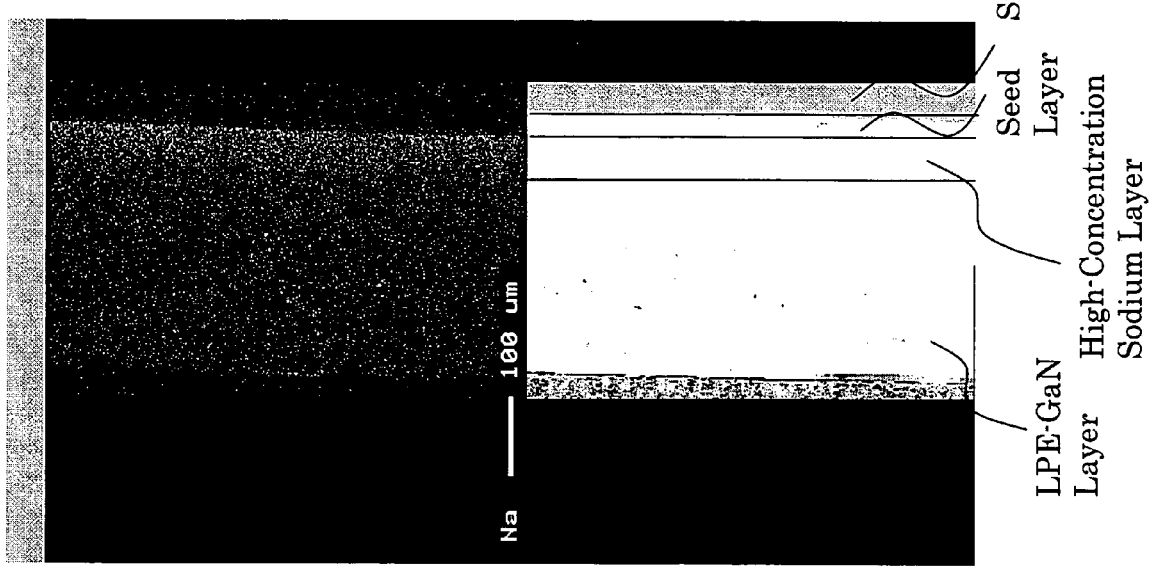
FIGS. 11A and 11B are cross-sectional views showing a further example of the substrate according to the present invention.

The high defect layer is characterized in growing at a high rate through regrowth that takes place after the seed layer is melted and having a natural surface (the high-rate growth region) of GaN crystals formed thereby. Crystals formed in this region are grown at a high rate with impurities contained in the melt being taken in. A flux component such as Na or a material of the crucible may be introduced as the impurities. With respect to the substrate with the LPE-GaN layer formed on the semiconductor seed layer, detailed evaluations of the impurities were carried out. As a result, a high-concentration sodium layer was observed. This result is shown in FIGS. 11A and 11B. FIGS. 11A and 11B show the results of component analysis made by a Wavelength Dispersive X-ray Spectrometer (WDX) method. FIG. 11A shows the results thus obtained while FIG. 11B shows a cross-section of the GaN substrate. As shown in FIG. 11B, the GaN layer to serve as the seed layer (the first layer) is present on the sapphire substrate, and the LPE-GaN layer (the second and third layers) has been formed thereon through the liquid phase epitaxy. It was observed in the LPE-GaN layer thus grown that a few % of sodium had been taken in as the impurities in the region (the second layer) adjacent to the seed layer (the first layer). However, no sodium was observed in the region (the third layer) located on the exposed surface side.

Figure 12:
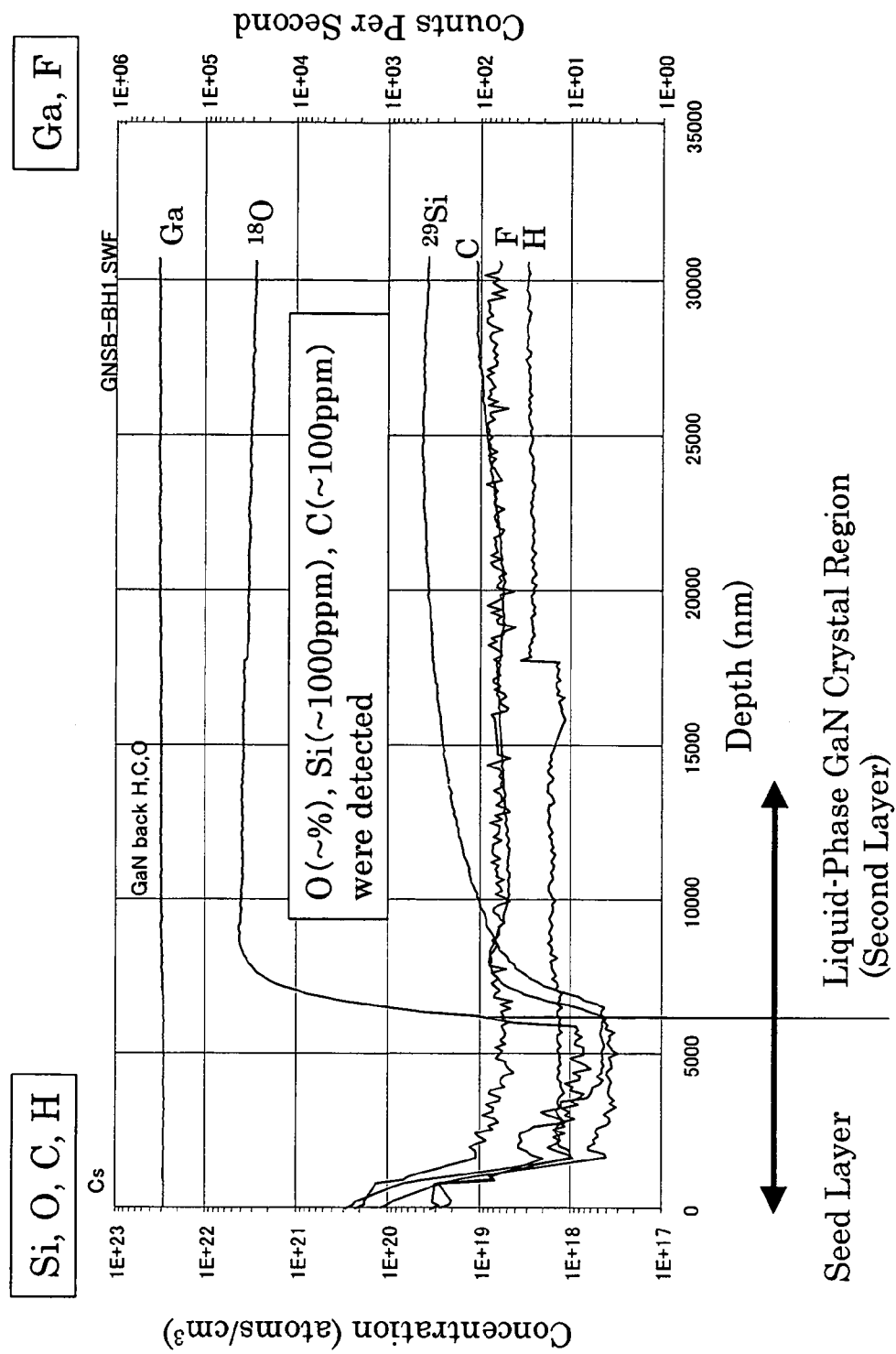
FIG. 12 is a graph showing results obtained by measuring impurity densities in still another example of the substrate according to the present invention.
Figure 13:
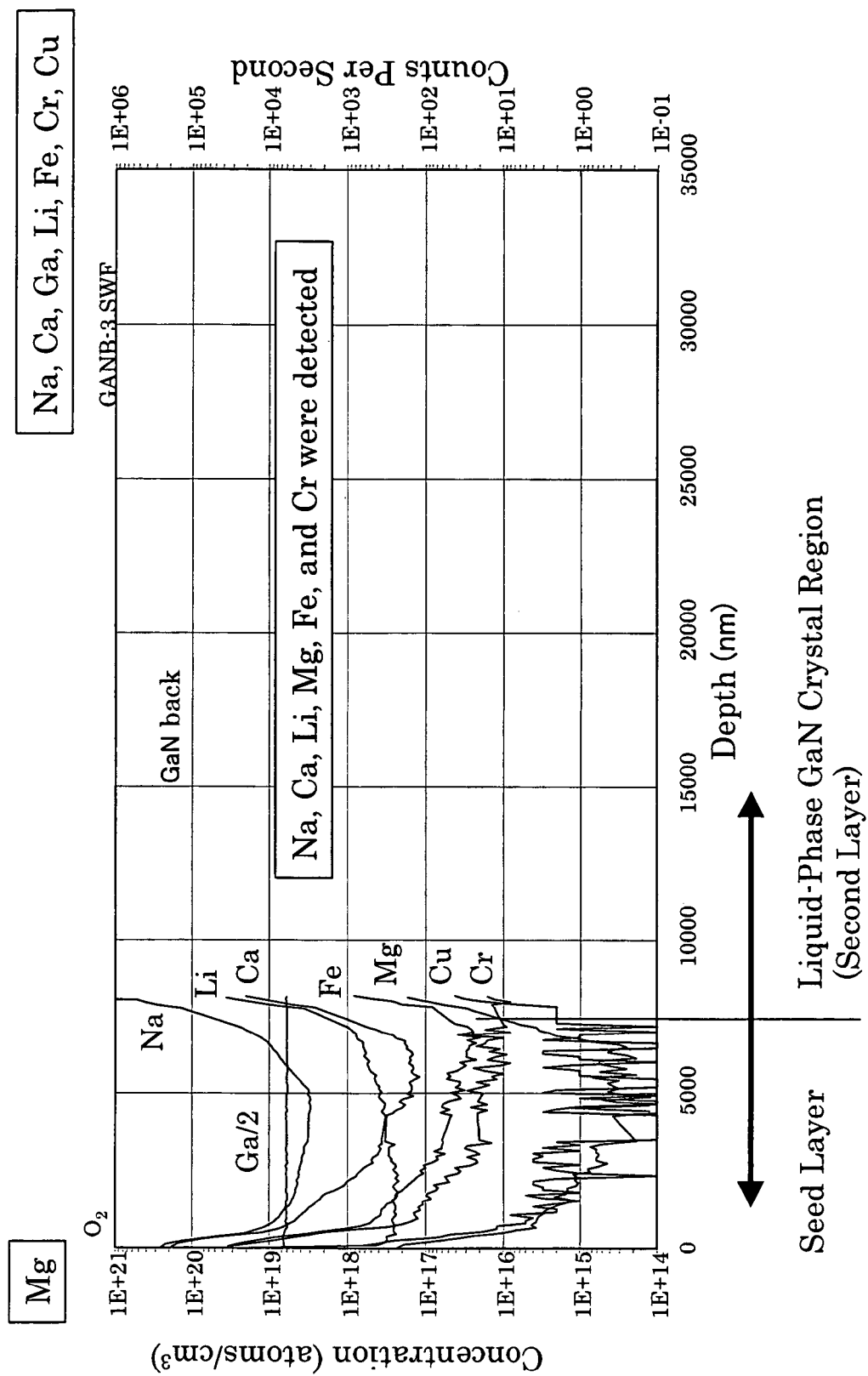
FIG. 13 is a graph showing results obtained by measuring impurity densities in yet another example of the substrate according to the present invention.
Figure 14:
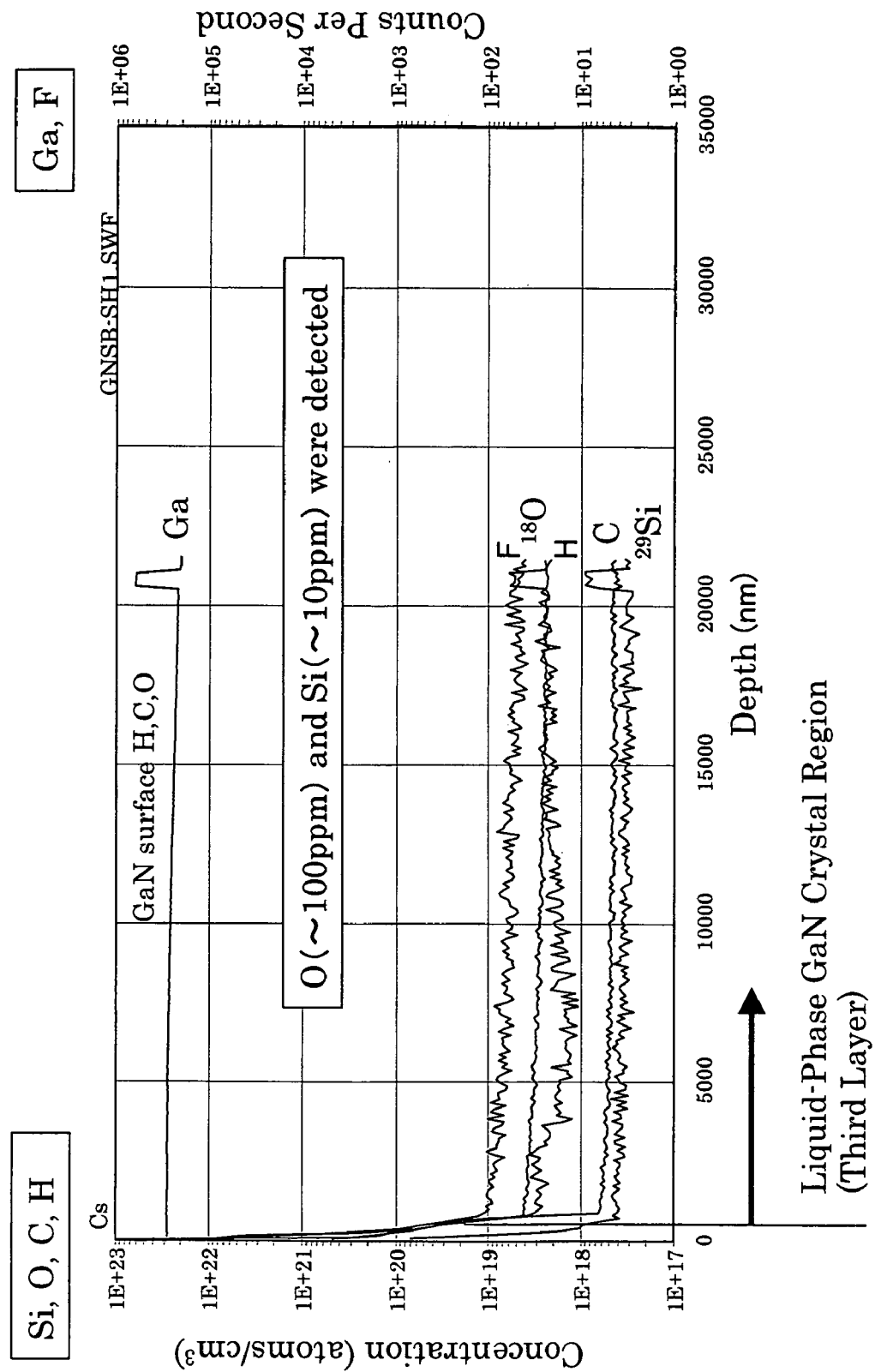
FIG. 14 is a graph showing results obtained by measuring impurity densities in a further example of the substrate according to the present invention.
Figure 15:
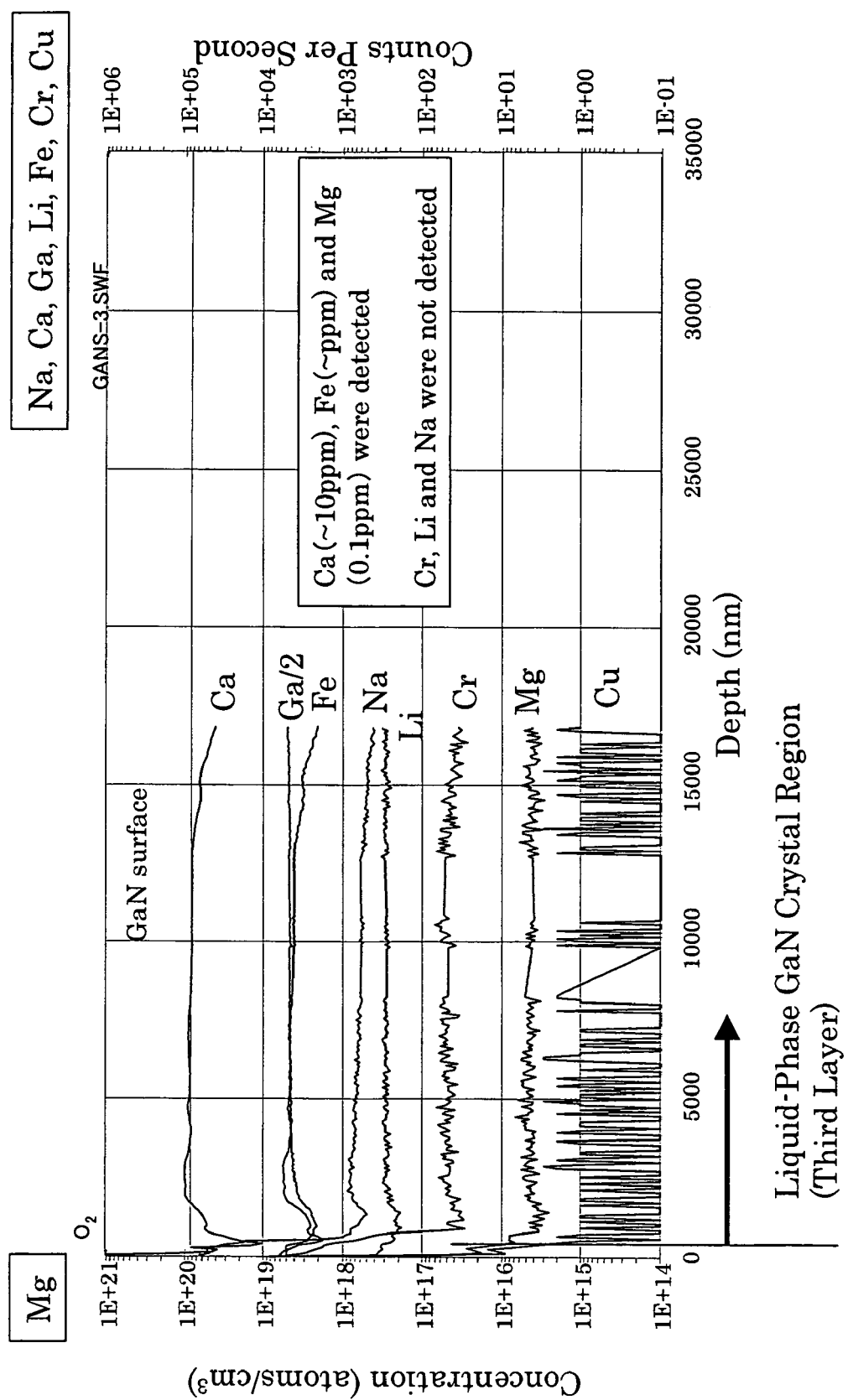
FIG. 15 is a graph showing results obtained by measuring impurity densities in still another example of the substrate according to the present invention.

Furthermore, the impurities were examined in detail. The results are shown in FIGS. 12, 13, 14, and 15. These graphs show the results of an impurity measurement carried out by the secondary ion mass spectrometry (SIMS) and indicate the thickness dependence of the impurity density in the GaN substrates obtained as examples. In this evaluation, GaN crystals were used that were produced on a seed layer using a Na flux, and the thickness dependence of the impurity densities of vicinities of the seed layer and the exposed crystal surface was evaluated. FIGS. 12 and 13 each show the impurity density of the region (the second layer) adjacent to the seed layer. They also show that the following impurities were detected: for instance, a Na flux; Ca, Li, and Mg (in the order of %) that were impurities contained in Na; Fe, Cr (in the order of %) and C (~100 ppm) that originate from the reactor vessel; and O (~%). Conceivably, the O detected in the above results from oxidation caused when sodium was weighed. In this case, it is possible that the detection of Si resulted from the mass interference caused when Si=N$^{14}$+ N$^{15}$. FIGS. 14 and 15 each show impurity densities of the region (the third layer) present in the vicinity of the exposed crystal surface. FIGS. 14 and 15 indicate the detection of trace amounts of Ca (~10 ppm), Mg (0.1 ppm), Fe (~ppm), and O (~100 ppm). It has been reported that Ca, Mg, Fe, and O are contained as N-type or P-type doping materials. In this examination, Na, Li, Cr, and C were not detected.

As described earlier, the second layer with a high impurity density also serves as a distortion alleviation layer. For instance, in the case where a first layer made of GaN is formed on a sapphire substrate and then GaN crystals are grown from a liquid phase on the first layer, the GaN crystals are distorted due to the difference in coefficient of linear expansion between the substrate and the GaN crystals when the GaN crystals are grown at a high temperature and then are cooled to room temperature. Hence, when GaN crystals having a thickness of at least 100 µm are grown, it is highly possible that cracks are caused therein. The presence of the second layer containing a high density of impurities alleviates the distortion caused by the difference in coefficient of linear expansion between the sapphire crystals and the GaN crystals. The third layer can be separated partially using the distortion caused between the second and third layers since the second layer contains a high density of impurities.

Moreover, when the second layer is irradiated with light, the substrate can be separated readily. This method is described below. The sapphire substrate transmits light whose wavelength is not longer than 143 nm while the GaN crystals can transmit light with a longer wavelength, specifically, up to about 370 nm. In the conventional method, the irradiation is carried out through the sapphire substrate using the third harmonic (with a pulse length of 5 nsec and a frequency of 10 Hz) of a Nd:YAG laser, and light is focused on the interface between the sapphire substrate and the GaN crystals. Consequently, the GaN crystals are decomposed to generate Ga and nitrogen gas and thereby voids are formed to separate them from each other. In the present invention, however, the use of the second layer allows the substrate to be separated more easily using low power light. Furthermore, the second layer contains a large amount of impurities and therefore has a higher absorptance of light within the visible-light transmission region. Hence, it also is possible to achieve the separation using visible light. Accordingly, the separation can be achieved easily using a low-cost apparatus.

The high defect layer mentioned above is grown at high rate and therefore includes regions with dense dislocations. When dislocations are caused in the transverse direction from the high-rate growth region of the high defect layer to make the high defect layer grow in the transverse direction, the LPE-GaN layer to be formed thereon is allowed to have a considerably reduced number of dislocations. In other words, the direction in which the dislocations are caused in the high defect layer is different from that in which the dislocations are caused in the seed layer and the LPE layer located thereon, and this allows the dislocation density to be reduced considerably.

In the present example, the high defect layer was formed by changing the pressure of the nitrogen atmosphere. However, it also can be formed by changing the melt temperature. For instance, first, the crucible 35 is kept at 900° C. and nitrogen gas is supplied at a pressure of 40 atm (40×1.013× $10^5$ Pa). In this stage, the GaN melt is in the unsaturation state. Consequently, the seed layer of the seed crystal substrate melts. Thereafter, the melt temperature is lowered to and kept at 800° C. and this allows the LPE growth to take place. This corresponds to the operation of lowering the temperature to change the state, which is indicated with the arrow B in the graph shown in FIG. 10.

Furthermore, the high defect layer also can be formed as follows. That is, the GaN melt is brought into a supersaturation state, with the seed layer being not melted, and then crystals are grown at high rate while taking in impurities therein. For instance, the crucible 35 is kept at 800° C. and nitrogen gas is supplied at a pressure of 50 atm (50×1.013× $10^5$ Pa). In this case, the impurities can be introduced into the GaN melt intentionally, or as described earlier, those originating from the crucible, reactor vessel, alkali metal, alkaline-earth metal, etc. also can be utilized.

Figure 6:
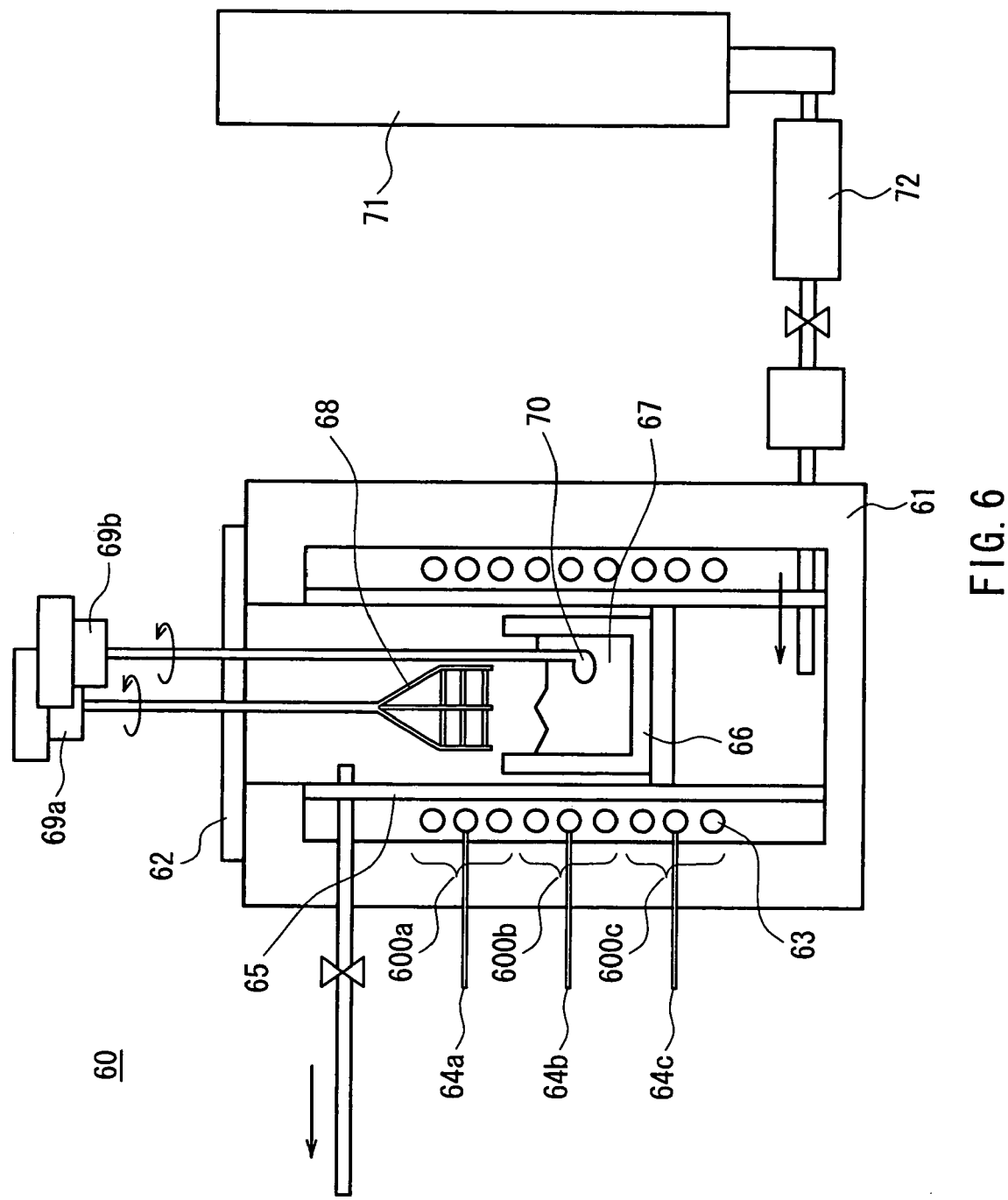
FIG. 6 is a schematic view showing the configuration of another example of the manufacturing apparatus to be used in the manufacturing method of the present invention.

FIG. 6 shows an example of a large LPE apparatus (an electric furnace) that can be used in the method of the present invention. The LPE apparatus 60 includes a chamber 61 and a furnace cover 62 that are made of stainless steel. The LPE apparatus is constructed to bear a pressure of 50 atm ($50 \times 1.013 \times 10^5$ Pa). Heaters 63 are provided inside the chamber 61. The chamber 61 is composed of three zones that are provided with thermocouples 64a, 64b, and 64c, respectively. The three zones are controlled so as to keep their temperature within a range of $\pm 0.1°$ C., and thereby the temperature inside the furnace is controlled to be uniform. A core tube 65 is provided to improve the uniformity of the temperature inside the furnace and to prevent impurities from being introduced from the heaters 63.

A crucible 66 made of boron nitride (BN) or alumina ($Al_2O_3$) is provided inside the core tube 65. A material is placed inside the crucible 66 and the temperature of the crucible 66 is raised. Thus, a melt 67 is prepared. A substrate to serve as seed crystals is attached to a substrate holding member 68. In the apparatus shown in FIG. 6, a plurality of substrates can be attached to the substrate holding member 68. The substrate is rotated by a rotary motor 69a. A stirring propeller 70 can be immersed in the melt 67. The propeller 70 is rotated by a rotary motor 69b. In the present example, a common rotary motor can be used since the ambient pressure is 10 atm ($10 \times 1.013 \times 10^5$ Pa) or lower. However, an electromagnetic induction rotary mechanism may be used under an ambient pressure exceeding 10 atm ($10 \times 1.013 \times 10^5$ Pa). Ambient gas is supplied from a gas source 71. The ambient pressure is regulated by a pressure regulator 72. The growth of GaN crystals that is carried out using the apparatus described above takes place, for instance, as follows.

(1) First, predetermined amounts of Ga and Na to serve as a flux are weighed and then are placed inside the crucible 66. Preferably, the Ga is one with a purity of 99.9999% (six nines), and the Na is purified Na. Na can be purified as follows: Na is heated to melt in a glove box, the inside of which has been subjected to He substitution, and then for example, oxides emerging on the surface layer are removed. Besides this method, zone refining may be used for purifying Na. In the zone refining, Na is melted and solidified repeatedly in a tube and thereby impurities deposit and then are removed. Thus, the purity of Na can be increased.

(2) In order to melt the raw material placed inside the crucible 66, the temperature inside the electric furnace is raised to 900° C. In this stage, the seed crystal substrate is not placed inside the crucible. In order to mix Ga and Na, the melt 67 is stirred for several hours, with the propeller 70 being immersed in the melt 67. In order to prevent GaN from being oxidized, it is preferable that nitrogen gas is used as the ambient gas.

(3) Next, the temperature of the crucible 66 is set at 800° C. to bring the melt into a supersaturation state. Subsequently, the seed crystal substrate is lowered to the position just above the surface of the melt 67 and its temperature is made to approach the temperature of the melt. After several minutes, the seed crystal substrate is put into the melt 67 to allow crystals to start growing.

(4) It is preferable that the substrate is rotated with the rotary motor 69a at a rotational speed in the range of 10 rpm to 200 rpm, more preferably around 100 rpm, during the crystal growth. After the crystals are grown for 24 hours, the substrate is lifted to be taken out from the melt 67. It is preferable that after being lifted, the substrate is rotated at a speed of 300 rpm to 1500 rpm, more preferably around 1000 rpm in order to remove the melt remaining on the substrate surface. Thereafter, the substrate is taken out of the chamber. During the crystal growth, the temperature of the crucible 66 (the temperature of the melt) may be kept constant. However, the temperature of the melt may be lowered at a constant rate to keep the supersaturation of the melt constant.

In the present example, a flux containing Na alone was used. However, a mixed flux containing alkali metal and alkaline-earth metal, such as, for example, Ca and a flux of Li, Na, or K. For instance, when using a mixed flux containing Na and Ca, the Ca mixed to account for about 10% of the whole allows crystals to grow under lower pressure.

EXAMPLE 2

Figure 7:
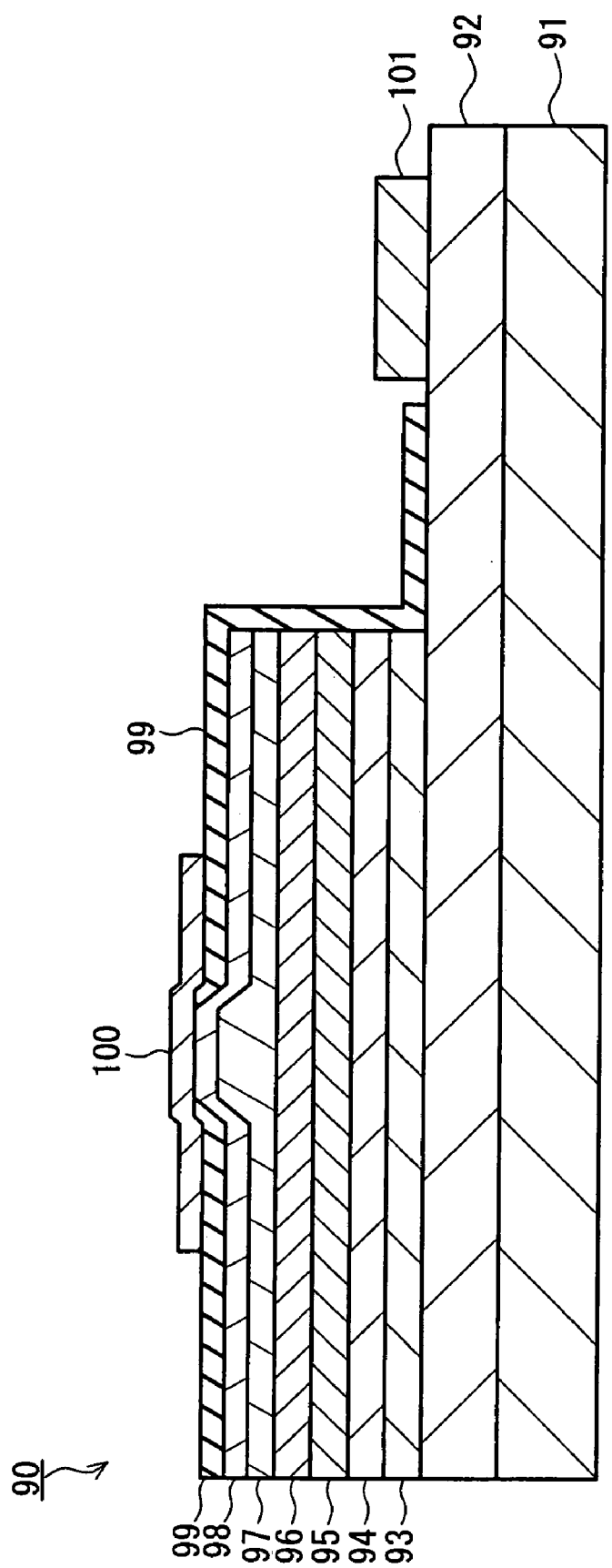
FIG. 7 is a cross-sectional schematic view showing an example of the semiconductor device according to the present invention.

In this example, the description is directed to an example of manufacturing a semiconductor laser using the substrate obtained in Example 1 described above. The configuration of the semiconductor laser is shown with its cross-sectional view in FIG. 7. This semiconductor laser can be manufactured, for instance, as follows.

First, a contact layer 92 of n-type GaN doped with Si to have a carrier density of $5 \times 10^{18}$ cm$^{-3}$ or lower is formed on a substrate 91 formed of GaN crystals that was obtained in Example 1. In GaN-based crystals (crystals containing Ga and N), when Si is added thereto as an impurity, holes present in Ga increase in number. Since the holes present in Ga diffuse easily, they have harmful effects in terms of, for example, lifetime when a device is formed thereon. Hence, the doping amount may be controlled so that the contact layer has a carrier density of $3 \times 10^{18}$ cm$^{-3}$ or lower.

Next, a cladding layer 93 of n-type $Al_{0.07}Ga_{0.93}N$ and a light guiding layer 94 of n-type GaN are formed on the contact layer 92. Subsequently, a multiple quantum well (MQW) composed of a well layer (with a thickness of about 3 nm) made of $Ga_{0.8}In_{0.2}N$ and a barrier layer (with a thickness of about 6 nm) made of GaN is formed as an active layer 95. Thereafter, a light guiding layer 96 of p-type GaN, a cladding layer 97 of p-type $Al_{0.07}Ga_{0.93}N$, and a contact layer 98 of p-type GaN are formed sequentially on the active layer 95. These layers can be formed by well-known methods. The semiconductor laser 90 is of a double-hetero junction type. The energy gap of the well layer containing indium in the MQW active layer is smaller than those of the n-type and p-type cladding layers containing aluminum. On the other hand, the highest optical refractive index is obtained in the well layer of the active layer 95, while the light guiding layers and the cladding layers have optical refractive indices decreased in this order.

An insulating film 99 forming a current injection region having a width of about 2 μm is formed on the contact layer 98. A ridge part to serve as a current constriction part is formed in the upper portion of the p-type cladding layer 97 and the p-type contact layer 98.

A p-side electrode 100 that is in ohmic contact with the contact layer 98 is formed on the upper side of the p-type contact layer 98. An n-side electrode 101 that is in ohmic contact with the contact layer 92 is formed on the upper side of the n-type contact layer 92.

The semiconductor laser thus produced was subjected to a device evaluation. When a predetermined forward voltage was applied between the p-side electrode and the n-side electrode of the semiconductor laser obtained in the above, positive holes and electrons were injected into the MQW active layer from the p-side electrode and the n-side electrode, respectively. The positive holes and electrons thus injected were recombined with each other in the MQW active layer to produce optical gain, and thereby the semiconductor laser generated oscillation with an emission wavelength of 404 nm.

In the present example, the description was made with respect to the GaN single crystal substrate. However, preferably, a substrate is provided that has a low absorptance at a wavelength that is used in an optical device to be produced on the substrate. Accordingly, it is preferable that a substrate for a semiconductor laser or a light emitting diode that emits light in the ultraviolet region is formed of $Al_xGa_{1-x}N$ (where $0 \leq x \leq 1$) single crystals that contain a large amount of Al and have low absorptivity with respect to light with short wavelengths. According to the present invention, such Group III nitride semiconductor single crystals can be formed even when part of Ga is substituted by another Group III element.

EXAMPLE 3

Figure 8:
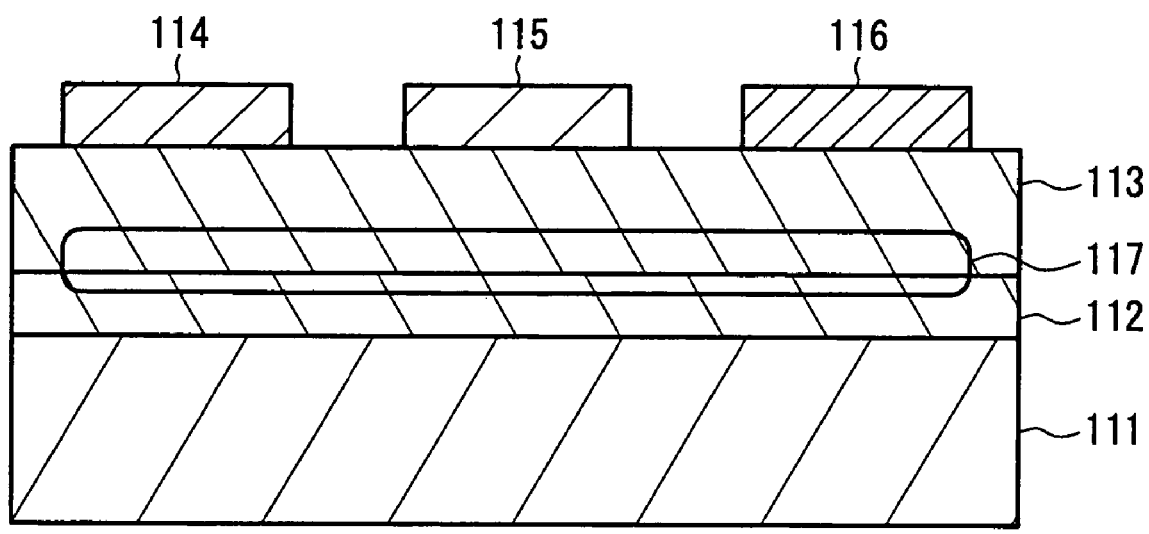
FIG. 8 is a cross-sectional schematic view showing another example of the semiconductor device according to the present invention.

In this example, the description is directed to an example of manufacturing a field effect transistor (FET) using the substrate obtained in Example 1. The configuration of the FET 110 is shown schematically in the cross-sectional view in FIG. 8. An undoped GaN substrate 111 is used as the substrate. The GaN substrate 111 can be obtained through the liquid phase epitaxy using a flux. The GaN substrate 111 obtained through the liquid phase epitaxy has an electrical resistance of, for instance, at least $10^{10}$ Ω and therefore has characteristics similar to those of an insulator. A GaN layer 112 and a AlGaN layer 113 are formed on the GaN substrate 111 by the MOCVD method. Furthermore, a source electrode 114, a gate electrode 115, and a drain electrode 116 are formed on the AlGaN layer 113. Voltage is applied to the gate electrode 115 and thereby the concentration of two-dimensional electron gas 117 that is generated at the interface between the GaN layer 112 and the AlGaN layer 113 is controlled. Thus the operation as a transistor is carried out.

The GaN substrate of the present invention has less defects and a low dislocation density and therefore has a high insulation ability. Hence, when a FET is produced using the GaN substrate of the present invention, the leakage current that is caused during the operation of the FET can be reduced and thereby a FET with an excellent high frequency property can be obtained.

EXAMPLE 4

In this example, the first layer and the second layer were produced in the same manner as in Example 1. The third layer was produced as follows. That is, transparent GaN crystals were grown while the growth temperature was changed to control the growth rate. More specifically, first, a substrate was placed in an alumina crucible. The substrate included a GaN seed layer with a size of 20 mm×20 mm and a GaN layer formed thereon. Subsequently, 10 g of sodium and 8.8 g gallium (the mole ratio: Ga/(Ga+Na)=27%) were weighed and then were placed inside the alumina crucible. The crucible then was placed in a pressure- and heat-resistant container made of Hastelloy, registered trademark of Haynes Stelite. The Hastelloy is a corrosion resisting alloy including Ni as the main component, Mo, Fe, Cr, and the like. The internal pressure of the container was set at 35 atm ($35 \times 1.013 \times 10^5$ Pa). Thereafter, the container was placed inside an electric furnace whose temperature was able to be controlled, and then crystal growth was started.

Figure 16A:
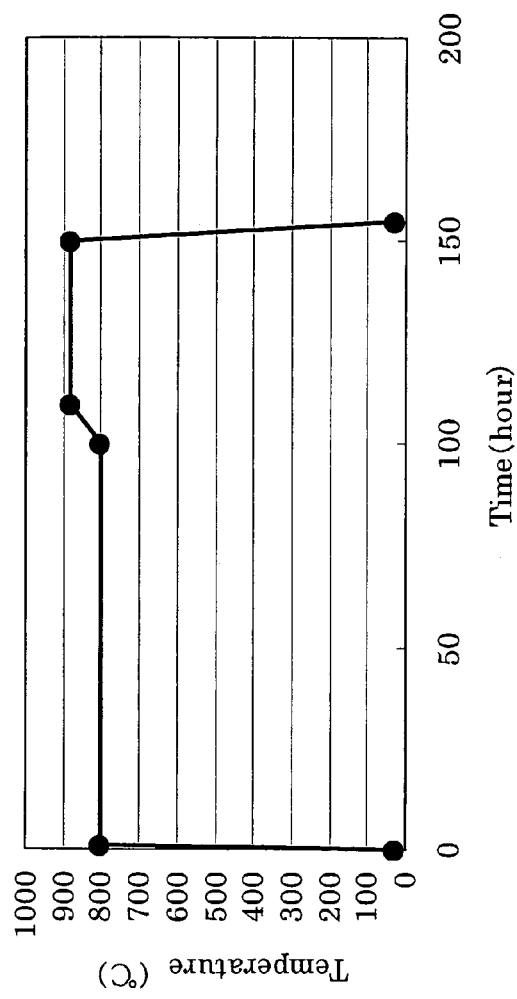
FIGS. 16A and 16B are graphs showing growing temperatures varied with the passage of time in further examples of the manufacturing method according to the present invention.

Next, the temperature inside the container was raised from room temperature to 800° C. in an hour. In this state, GaN crystals were grown for 100 hours. Subsequently, the growth temperature was raised to 880° C. in 10 hours and was kept for 40 hours. Thereafter, cooling was carried out. FIG. 16A shows the relationship between time and temperature. Such temperature change allows the growth rate to be controlled and thereby crystals with fewer defects can be grown at a higher rate. In this example, two stages of growth rates were employed. The present invention, however, is not limited to this. For instance, another method also can be used in which the growth rate is decreased stepwise using at least three stages of growth rates.

EXAMPLE 5

Figure 16B:
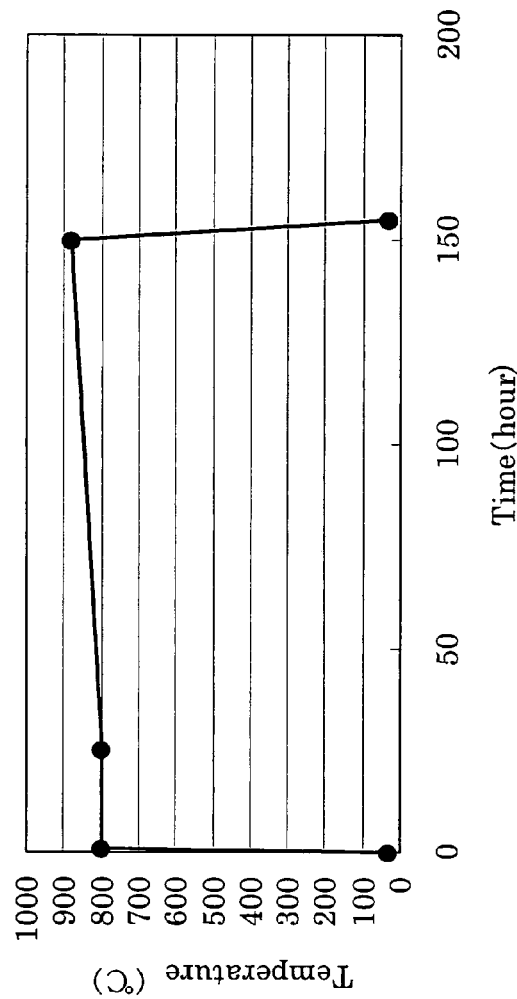

In this example, the growth temperature was raised continuously to decrease the growth rate continuously. Consequently, higher transparency GaN crystals were grown. First, crystal growth was started in the same manner as in Example 4. The temperature inside the container then was raised from the room temperature to 800° C. in one hour. In this state, GaN crystals were grown for 24 hours. Thereafter, the growth temperature was raised continuously to 880° C. in 125 hours and then cooling was carried out. FIG. 16B shows the temperature variations with time.

Observation with Optical Microscope

Figure 17:
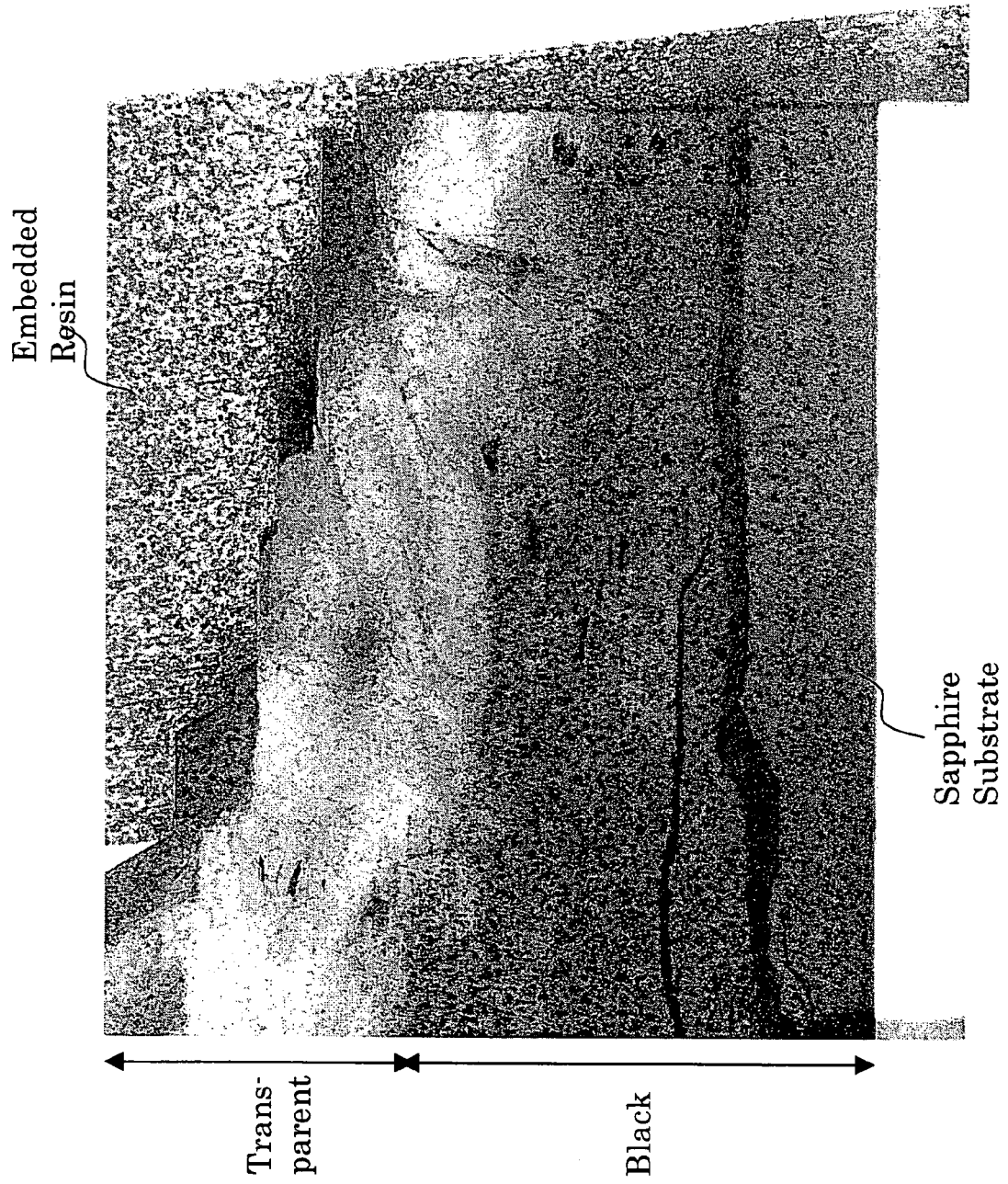
FIG. 17 is an optical microphotograph showing the cross section of a substrate obtained by yet another example of the manufacturing method according to the present invention.

The crystals thus obtained were observed with an optical microscope. FIG. 17 shows the result. In the GaN crystals that were grown from the second layer located on the seed layer provided on the sapphire substrate, it was observed that part of the GaN crystals that was located in the vicinity of the seed substrate was colored but the surface portions of the grown GaN crystals were transparent. The growth rate decreases as the GaN crystals grow from the vicinity of the seed substrate toward their surface portions. Accordingly, in the early stage of the growth, the coloring is caused but high growth rates can be secured while in the later stage of the growth, the growth rate is decreased and thereby transparent crystals were obtained that had low absorptance even with respect to the light in the visible region. In the optical microphotograph shown in FIG. 17, the second layer cannot be seen since it is very thin.

Determination of Impurity Distribution by SIMS

Subsequently, the impurity distribution in the thickness direction was determined by the SIMS. Large amounts of Na, Mg, Ca, Li (impurities contained in Na), O (atmosphere), Fe, C (contained in, for instance, the pressurized container and crucible materials), etc. were detected as impurities in the vicinity of the sapphire substrate (the seed layer) as in the results of the observation of black crystals. On the other hand, trace amounts of Mg, Ca, Fe, and O only were detected in the transparent region of the surface portions.

That is, as in the present example, when the growth rate is high in the early stage of the growth and is decreased in the later stage of the growth in forming the third layer, crystals include a lot of impurities such as, for example, oxygen, alkali metal, and alkaline-earth metal but can be grown to form a thick film at a high rate in the vicinity of the seed substrate. Consequently, transparent crystals with less defects and impurities can be obtained in the vicinity of their surfaces.

The carrier density distribution in the thickness direction in the crystals obtained in the above was determined. As a result, the carrier density distribution found in the portions of the GaN crystals located in the vicinity of the seed substrate was higher than that of those located in the vicinity of their surfaces.

Measurement of Photoluminescence (PL) Intensity

Crystals were excited with a HeCd laser (325 nm) and thereby the photoluminescence intensity was measured. In the case of luminescence with a wavelength around 362 nm lying at the band edge, the full width at half maximum of luminescence spectrum obtained in the portions of the GaN crystals located in the vicinity of the seed substrate was greater than that obtained in the portions of the GaN crystals located in the vicinity of their surfaces. On the other hand, in the case of luminescence with a wavelength around 420 nm lying in the blue band, the luminescence intensity obtain in the portions of the GaN crystals located in the vicinity of the seed substrate was higher than that obtained in the portions of the GaN crystals located in the vicinity of their surfaces.

The results of the above-mentioned evaluations also indicate that the crystals that were located in the vicinity of their surface and grew at a low rate include less impurities and defects than those included in the crystals that were located in the vicinity of the seed substrate and grew at a high rate, and thus were favorable crystals. The GaN crystals produced by the manufacturing method of the present invention can be manufactured at low cost, with a high growth rate being secured. Consequently, the GaN crystals provides great practical effects.

EXAMPLE 6

Figure 18A:
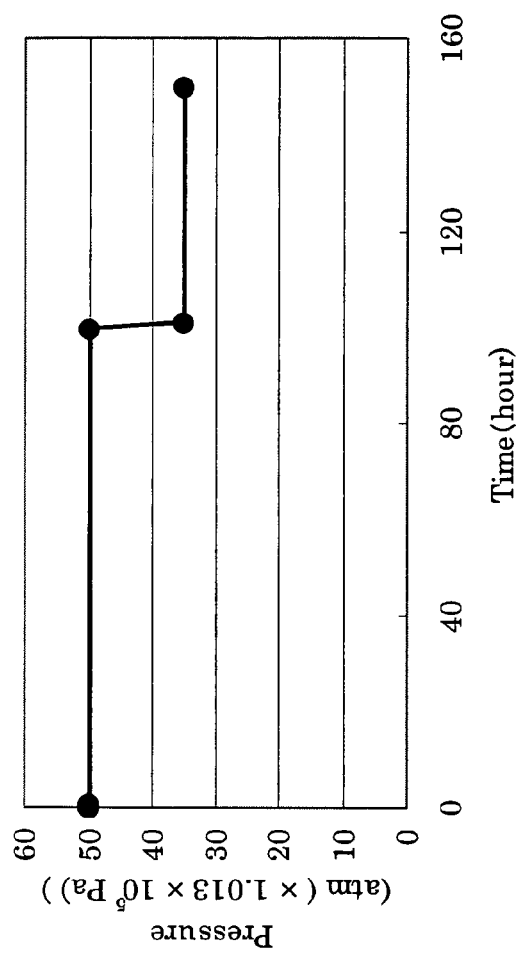
FIGS. 18A and 18B are graphs showing growing pressures varied with the passage of time in further examples of the manufacturing method according to the present invention.

In this example, the growth pressure was reduced stepwise to decrease the growth rate stepwise. Thus, higher transparency GaN crystals were grown. Specifically, first, the crystal growth was started in the same manner as in Example 4. The temperature inside the container then was raised from the room temperature to 880° C. in one hour. The pressure inside the container was regulated at 50 atm ($50 \times 1.013 \times 10^5$ Pa). In this state, GaN crystals were grown for 100 hours. Thereafter, the pressure inside the container was reduced to 35 atm ($35 \times 1.013 \times 10^5$ Pa). In this state, GaN crystals were grown for 50 hours and then were cooled. FIG. 18A shows the relationship between time and pressure. In the present example, two stages of growth rates were employed but the present invention is not limited thereto. For instance, another method also can be used in which the growth rate is decreased stepwise using at least three stages of growth rates.

EXAMPLE 7

Figure 18B:
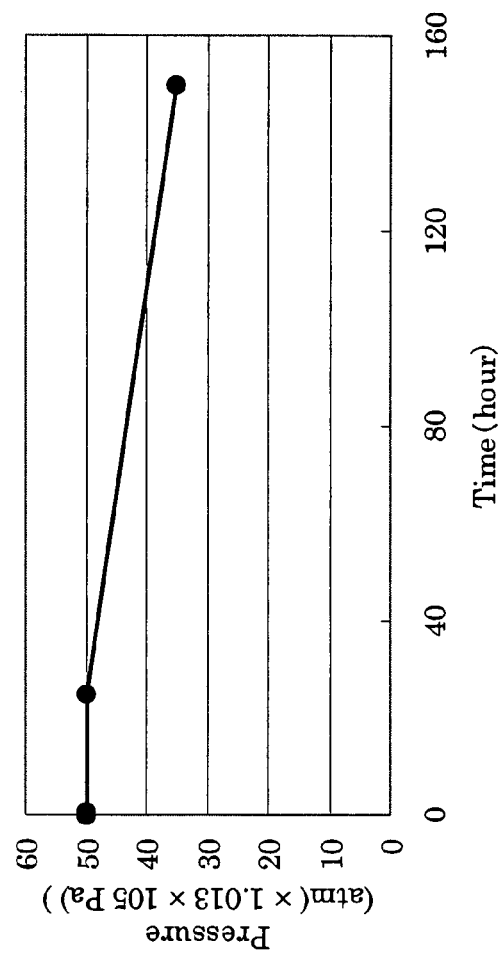

In this example, the growth pressure was reduced continuously to decrease the growth rate continuously. Thus, GaN crystals with higher transparency were grown. Specifically, first, the crystal growth was started in the same manner as in Example 4. The temperature inside the container then was raised from the room temperature to 880° C. in one hour. The initial pressure inside the container was set at 50 atm ($50 \times 1.013 \times 10^5$ Pa). In this state, GaN crystals were grown for 24 hours. Thereafter, the pressure inside the container was reduced to 35 atm ($35 \times 1.013 \times 10^5$ Pa) continuously in 125 hours and then cooling was carried out. FIG. 18B shows the relationship between time and pressure. As a result, similar effects to those obtained by the method employed in Example 4 were obtained and the surfaces of the GaN crystals thus obtained were transparent and had fewer nitrogen defects.

As described above, when the pressure and temperature are controlled individually, the growth rate is controlled to grow GaN crystals at a higher growth rate in the early stage of their growth and to grow them at a lower growth rate in the later stage of their growth. Accordingly, transparent GaN crystals were obtained that had fewer nitrogen defects and high crystallinity. Consequently, GaN crystals with high crystallinity and fewer dislocations were obtained in a short growth time. In this example, the examination results were those obtained in the case of using the Na flux. However, similar effects can be obtained even when another flux is used. For instance, the alkali metal and alkaline-earth metal mentioned earlier may be used as a flux (a melt).

As described above, when a higher growth pressure (or a lower temperature) is employed in the early stage of their growth while a lower growth pressure (or a higher temperature) is employed in the later stage of their growth, which allows the growth rate to decrease stepwise or continuously, transparent GaN crystals with fewer nitrogen defects and high crystallinity can be obtained.

Accordingly, the present invention can provide: Group III nitride crystals that are of high quality, can be manufactured efficiently, and are useful as a substrate for semiconductor manufacturing processes; a method of manufacturing the same; and a semiconductor device with the same.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. Group III nitride crystals, comprising:
    a first layer made of a semiconductor that is expressed by a composition formula of $Al_sGa_tIn_{1-s-t}N$ (where $0 \leq s \leq 1$, $0 \leq t \leq 1$, and $s+t \leq 1$);
    a second layer formed on the first layer; and
    a third layer made of a semiconductor that is expressed by a composition formula of $Al_uGa_vIn_{1-u-v}N$ (where $0 \leq u \leq 1$, $0 \leq v \leq 1$, and $u+v \leq 1$) and is formed on the second layer by a liquid phase epitaxy method,
    wherein the second layer includes nitrogen and at least one element selected from the group consisting of gallium, aluminum, and indium, and
    wherein the first layer, the second layer, and the third layer each has a crystal structure at least in a part thereof, and the defect density of the crystal structure of the second layer is higher than that of the third layer.

2. The Group III nitride crystals according to claim 1, wherein the defect density includes a dislocation density.

3. The Group III nitride crystals according to claim 2, wherein the dislocation density is that of at least one of edge dislocations and screw dislocations.

4. The Group III nitride crystals according to claim 2, wherein the second layer has a dislocation density that is at least 100 times higher than that of the third layer.

5. The Group III nitride crystals according to claim 2, wherein the second layer has a dislocation density of at least $10^8$ cm$^{-2}$.

6. The Group III nitride crystals according to claim 2, wherein the third layer has a dislocation density of higher than zero but not higher than $10^6$ cm$^{-2}$.

7. The Group III nitride crystals according to claim 1, wherein an interface between the first layer and the second layer has a concave-convex shape.

8. The Group III nitride crystals according to claim 1, wherein the second layer and the third layer are formed by immersing the first layer in a melt to carry out crystal growth in an atmosphere including nitrogen, and the melt contains nitrogen, at least one of alkali metal and alkaline-earth metal, and at least one Group III element selected from the group consisting of gallium, aluminum, and indium.

9. The Group III nitride crystals according to claim 1, wherein the third layer is formed of gallium nitride (GaN) crystals.

10. The Group III nitride crystals according to claim 1, wherein the third layer is formed of aluminum nitride (AlN) crystals.

11. The Group III nitride crystals according to claim 1, wherein the defect density includes an impurity density.

12. The Group III nitride crystals according to claim 11, wherein at least one of the first layer, the second layer, and the third layer is formed by a liquid phase method using at least one of alkali metal and alkaline-earth metal, and the impurity density is a density of impurities originating from at least one of the alkali metal and alkaline-earth metal.

13. The Group III nitride crystals according to claim 11, wherein at least one of the first layer, the second layer, and the third layer is formed using a crucible, and the impurity density is a density of impurities originating from at least one component of a material forming the crucible, the at least one component being selected from the group consisting of Y (yttrium), Sm (samarium), Zr (zirconium), W (tungsten), B (boron), Ta (tantalum), Si (silicon), C (carbon), and Ce (cerium).

14. The Group III nitride crystals according to claim 11, wherein at least one of the first layer, the second layer, and the third layer is formed using a reactor vessel, and the impurity density is a density of impurities originating from at least one component of a material forming the reactor vessel, the at least one component being selected from the group consisting of Fe (iron), Ni (nickel), Cr (chromium), Cu (copper), W (tungsten), Ta (tantalum), Y (yttrium), Sm (samarium), Zr (zirconium), B (boron), Si (silicon), C (carbon), and Ce (cerium).

15. The Group III nitride crystals according to claim 11, wherein a portion of the third layer located on an exposed surface side thereof has an impurity density of higher than zero but not higher than 1 ppm.

16. The Group III nitride crystals according to claim 11, wherein a portion of the third layer located on an exposed surface side thereof has an impurity density of higher than zero but not higher than 0.1 ppm.

17. The Group III nitride crystals according to claim 11, wherein the second layer has an impurity density of at least 100 ppm.

18. The Group III nitride crystals according to claim 1, wherein the first layer is formed on a substrate.

19. The Group III nitride crystals according to claim 18, wherein the substrate is one selected from the group consisting of a GaAs substrate whose surface is a (111) plane, a Si substrate whose surface is a (111) plane, a sapphire substrate whose surface is a (0001) plane, and a SiC substrate whose surface is a (0001) plane.

20. The Group III nitride crystals according to claim 18, wherein the substrate and the third layer can be separated from each other at any position between one side of the second layer in contact with the first layer and the other side of the second layer in contact with the third layer, and thereby the third layer alone can be used as a substrate for manufacturing a semiconductor.

21. The Group III nitride crystals according to claim 1, wherein the third layer of the Group III nitride crystals satisfies a relationship of N1>N2, where N1 denotes a defect density of its portion located on a side of the second layer while N2 indicates a defect density of its portion located on a side of its exposed surface.

22. The Group III nitride crystals according to claim 21, wherein the defect density includes an impurity density.

23. The Group III nitride crystals according to claim 22, wherein the third layer is formed by a liquid phase method using at least one of alkali metal and alkaline-earth metal, and the impurity density is a density of impurities originating from at least one of the alkali metal and alkaline-earth metal.

24. The Group III nitride crystals according to claim 22, wherein the third layer is formed using a crucible, and the impurity density is a density of impurities originating from at least one component of a material forming the crucible, the at least one component being selected from the group consisting of Y (yttrium), Sm (samarium), Zr (zirconium), W (tungsten), B (boron), Ta (tantalum), Si (silicon), C (carbon), and Ce (cerium).

25. The Group III nitride crystals according to claim 22, wherein the third layer is formed using a reactor vessel, and the impurity density is a density of impurities originating from at least one component of a material forming the reactor vessel, the at least one component being selected from the group consisting of Fe (iron), Ni (nickel), Cr (chromium), Cu (copper), W (tungsten), Ta (tantalum), Y (yttrium), Sm (samarium), Zr (zirconium), B (boron), Si (silicon), C (carbon), and Ce (cerium).

26. The Group III nitride crystals according to claim 22, wherein the portion of the third layer located on the exposed surface side thereof has an impurity density of higher than zero but not higher than 1 ppm.

27. The Group III nitride crystals according to claim 22, wherein the portion of the third layer located on the exposed surface side thereof has an impurity density of higher than zero but not higher than 0.1 ppm.

28. The Group III nitride crystals according to claim 1, wherein the third layer includes a visible-light transmission region and satisfies a relationship of K1>K2, where K1 denotes an absorption coefficient of a part of the visible-light transmission region located on a side of the second layer and K2 indicates an absorption coefficient of a part of the visible-light transmission region located on a side of an exposed surface of the third layer.

29. The Group III nitride crystals according to claim 28, wherein the absorption coefficient (K2) of the part of the visible-light transmission region located on the side of the exposed surface of the third layer is higher than zero but not higher than 100 per cm.

30. The Group III nitride crystals according to claim 28, wherein the absorption coefficient (K2) of the part of the visible-light transmission region located on the side of the exposed surface of the third layer is higher than zero but not higher than 10 per cm.

31. A semiconductor device, comprising a Group III nitride substrate used therein,
wherein the Group III nitride substrate is Group III nitride crystals according to claim 1.

32. The semiconductor device according to claim 31, wherein the semiconductor device is a laser diode or a light emitting diode.

33. The Group III nitride crystals according to claim 1, wherein the second layer has a defect density that is at least 100 times higher than that of the third layer.

34. Group III nitride crystals, comprising:
a seed crystal layer; and
a Group III nitride crystal layer formed on the seed crystal layer by a liquid phase epitaxy method using a melt,
wherein the seed crystal layer and the Group III nitride crystal layer are made of Group III nitride crystals expressed by a composition formula of $Al_sGa_tIn_{1-s-t}N$ (where $0 \leq s \leq 1$, $0 \leq t \leq 1$, and $s+t \leq 1$),
the Group III nitride crystal layer is formed by bringing the seed crystal layer into contact with the melt that is in an unsaturation state and then changing the melt into a supersaturation state, and
in the Group III nitride crystal layer, the defect density of the Group III nitride crystals on a seed crystal side is at least 100 times higher than that of the Group III nitride crystals on an exposed surface side.

35. A method of manufacturing Group III nitride crystals according to claim 1, the method comprising:
(i) forming a first layer made of a semiconductor that is expressed by a composition formula of $Al_sGa_tIn_{1-s-t}N$ (where $0 \leq s \leq 1$, $0 \leq t \leq 1$, and $s+t \leq 1$);
(ii) forming a second layer on a surface of the first layer by bringing the surface of the first layer into contact with a melt in an atmosphere including nitrogen, and the melt including nitrogen, at least one selected from the group consisting of gallium, aluminum, and indium, and at least one of alkali metal and alkaline-earth metal; and
(iii) forming, on the second layer, a third layer in the melt in an atmosphere including nitrogen, the third layer being made of a semiconductor that is expressed by a composition formula of $Al_uGa_vIn_{1-u-v}N$ (where $0 \leq u \leq 1$, $0 \leq v \leq 1$, and $u+v \leq 1$), and the third layer having a lower defect density defect density than that of the second layer.

36. The method of manufacturing Group III nitride crystals according to claim 35, wherein the defect density includes a dislocation density.

37. The method of manufacturing Group III nitride crystals according to claim 36, wherein the dislocation density is that of at least one of edge dislocations and screw dislocations.

38. The method of manufacturing Group III nitride crystals according to claim 36, wherein the second layer has a dislocation density that is at least 100 times higher than that of the third layer.

39. The method of manufacturing Group III nitride crystals according to claim 36, wherein the second layer has a dislocation density of at least $10^8$ $^{-2}$.

40. The method of manufacturing Group III nitride crystals according to claim 35, wherein in the process (ii), the melt is changed from an unsaturation state into a supersaturation state, and in the process (iii), the melt is in the supersaturation state.

41. The method of manufacturing Group III nitride crystals according to claim 40, wherein in the process (ii), at least a part of the surface of the first layer is melted by the melt that is in the unsaturation state, and thereafter the second layer is formed thereon.

42. The method of manufacturing Group III nitride crystals according to claim 35, wherein a gallium nitride (GaN) crystal layer is formed as the third layer.

43. The method of manufacturing Group III nitride crystals according to claim 35, wherein an aluminum nitride (AlN) crystal layer is formed as the third layer.

44. The method of manufacturing Group III nitride crystals according to claim 35, wherein the atmospheres including nitrogen employed in the processes (ii) and (iii) each are a pressurized atmosphere.

45. The method of manufacturing Group III nitride crystals according to claim 35, wherein in the process (i), the first layer is formed on a substrate.

46. The method of manufacturing Group III nitride crystals according to claim 45, wherein the substrate is one selected from the group consisting of a GaAs substrate whose surface is a (111) plane, a Si substrate whose surface is a (111) plane, a sapphire substrate whose surface is a (0001) plane, and a SiC substrate whose surface is a (0001) plane.

47. The method of manufacturing Group III nitride crystals according to claim 45, wherein the method further comprising, after the process (iii), a process (iv) of separating the substrate and the third layer from each other at any position between one side of the second layer in contact with the first layer and the other side of the second layer in contact with the third layer.

48. The method of manufacturing Group III nitride crystals according to claim 47, wherein the process (iv) is a process of irradiating the second layer with light.

49. The method of manufacturing Group III nitride crystals according to claim 35, wherein the process (ii) is a process of forming a gallium nitride (GaN) layer as the second layer, the melt includes gallium and sodium, and the process (ii) is carried out initially at a pressure of less than a minimum pressure P (atm ($P \times 1.013 \times 10^5$ Pa)) that is required for generating GaN crystals at a temperature ($T^\circ$ C.) of the melt, and then at a pressure of higher than the minimum pressure P (atm ($P \times 1.013 \times 10^5$ Pa)).

50. The method of manufacturing Group III nitride crystals according to claim 49, wherein the temperature of the melt is in a range of 600° C. to 950° C., and the minimum pressures P (atm ($P \times 1.013 \times 10^5$ Pa)) that is required for generating GaN crystals at various temperatures ($T^\circ$ C.) of the melt are as follows:

| Mixed Melt Temperature T (° C.) | Minimum Pressure P required for generating GaN Crystals (atm ($P \times 1.013 \times 10^5$ Pa)) |
| --- | --- |
| 600 | 50 |
| 700 | 5 |
| 750 | 5 |
| 800 | 10 |
| 850 | 15 |
| 880 | 25 |
| 900 | 40 |
| 950 | 70. |

51. The method of manufacturing Group III nitride crystals according to claim 35, wherein in the process (iii), a growth rate at which the third layer grows in a thickness direction is reduced stepwise or continuously.

52. The method of manufacturing Group III nitride crystals according to claim 51, wherein the growth rate at which the third layer grows is reduced stepwise or continuously by raising growth temperature.

53. The method of manufacturing Group III nitride crystals according to claim 51, wherein the growth rate at which the third layer grows is reduced stepwise or continuously by reducing growth pressure.

54. A method of manufacturing a Group III nitride substrate, comprising growing Group III nitride crystals by a method of manufacturing Group III nitride crystals according to claim 35.

55. The Group III nitride crystals according to claim 1, wherein the Group III nitride crystals can be used as a Group III nitride substrate.

* * * * *

UNITED STATES PATENT AND TRADEMARK OFFICE
CERTIFICATE OF CORRECTION

PATENT NO. : 7,309,534 B2  
APPLICATION NO. : 10/856467  
DATED : December 18, 2007  
INVENTOR(S) : Kitaoka et al.

It is certified that error appears in the above-identified patent and that said Letters Patent is hereby corrected as shown below:

Column 25, Line 35: "defect density defect density" should read --defect density--.

Signed and Sealed this

Sixteenth Day of December, 2008

JON W. DUDAS  
*Director of the United States Patent and Trademark Office*

UNITED STATES PATENT AND TRADEMARK OFFICE
CERTIFICATE OF CORRECTION

PATENT NO. : 7,309,534 B2  Page 1 of 1
APPLICATION NO. : 10/856467
DATED : December 18, 2007
INVENTOR(S) : Kitaoka et al.

It is certified that error appears in the above-identified patent and that said Letters Patent is hereby corrected as shown below:

Title Page, (73) Assignees: "INdustrial" should read --Industrial--.
Title Page, (56) References Cited, Other Publications: --Fumio KAWAMURA et al., "Growth of a large GaN Single Crystal Using the Liquid Phase Epitaxy (LPE) Technique", Jpn. J. Applied Physics, Vol. 42, January 2003, pp. 4-6.-- should be added.

Signed and Sealed this

Third Day of February, 2009

JOHN DOLL
*Acting Director of the United States Patent and Trademark Office*